(12) United States Patent
Ha et al.

(10) Patent No.: US 11,073,864 B2
(45) Date of Patent: Jul. 27, 2021

(54) DISPLAY DEVICE

(71) Applicant: SAMSUNG DISPLAY CO., LTD., Yongin-si (KR)

(72) Inventors: Seung Hwa Ha, Hwaseong-si (KR); Ja Seung Ku, Seoul (KR); Seung Ho Jung, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/858,076

(22) Filed: Apr. 24, 2020

(65) Prior Publication Data

US 2021/0004048 A1 Jan. 7, 2021

(30) Foreign Application Priority Data

Jul. 4, 2019 (KR) .......................... 10-2019-0080852

(51) Int. Cl.
*G06F 1/16* (2006.01)
*G06K 9/00* (2006.01)

(52) U.S. Cl.
CPC .......... *G06F 1/1616* (2013.01); *G06F 1/1643* (2013.01); *G06F 1/1684* (2013.01); *G06K 9/0002* (2013.01)

(58) Field of Classification Search
CPC .... G06F 1/1616; G06F 1/1643; G06F 1/1652; G06F 1/1684; G06F 3/0412;

(Continued)

(56) References Cited

U.S. PATENT DOCUMENTS

2017/0352706 A1* 12/2017 Choi ..................... H01L 27/323
2018/0122863 A1    5/2018 Bok
(Continued)

FOREIGN PATENT DOCUMENTS

KR  10-2018-0059720   6/2018
KR  10-2018-0130151  12/2018
KR  10-2019-0030907   3/2019

OTHER PUBLICATIONS

Extended European Search Report dated Nov. 26, 2020 in corresponding Application No. EP 20182807.6.

*Primary Examiner* — Nelson M Rosario
(74) *Attorney, Agent, or Firm* — F. Chau & Associates, LLC

(57) ABSTRACT

A display device includes a display panel disposed in a first non-folding region, a second non-folding region, and a folding region located between the first and second non-folding regions. The display device further includes first and second buffer members disposed on one surface of the display panel in the first and second non-folding regions, respectively, and a metal layer disposed in the first non-folding region, the second non-folding region, and the folding region on one surface of the first buffer member and one surface of the second buffer member. The display device further includes a fingerprint sensor disposed on the metal layer. The first and second buffer members are separated with the folding region therebetween. The metal layer includes first, second, and third metal portions located in the first non-folding region, the second non-folding region, and the folding region, respectively. The fingerprint sensor is attached to the third metal portion.

20 Claims, 19 Drawing Sheets

(58) Field of Classification Search
CPC .. G06F 3/04164; G06F 3/0443; G06F 3/0446; G06F 3/0447; G06F 2203/04102; G06F 2203/04108; G06F 2203/04112; G06K 9/0002; G09F 9/301; H01L 27/3225; H01L 51/0097; H01L 2251/5338; H01L 27/323; H01L 51/5012; H01L 51/5234; H01L 2251/5323; Y02E 10/549; G09G 3/3208; G09G 3/3233; G09G 3/3258; G09G 3/3674; G09G 2300/0426; G09G 2300/0819; G09G 2300/0842; G09G 2300/0861; G09G 2310/0251; G09G 2310/0262; G09G 2320/0233
See application file for complete search history.

(56) References Cited

U.S. PATENT DOCUMENTS

| | | | |
|---|---|---|---|
| 2019/0057267 A1 | 2/2019 | Kitchens, II et al. | |
| 2019/0064958 A1* | 2/2019 | Liu | G06F 3/0446 |
| 2019/0073505 A1 | 3/2019 | Kwon et al. | |

* cited by examiner

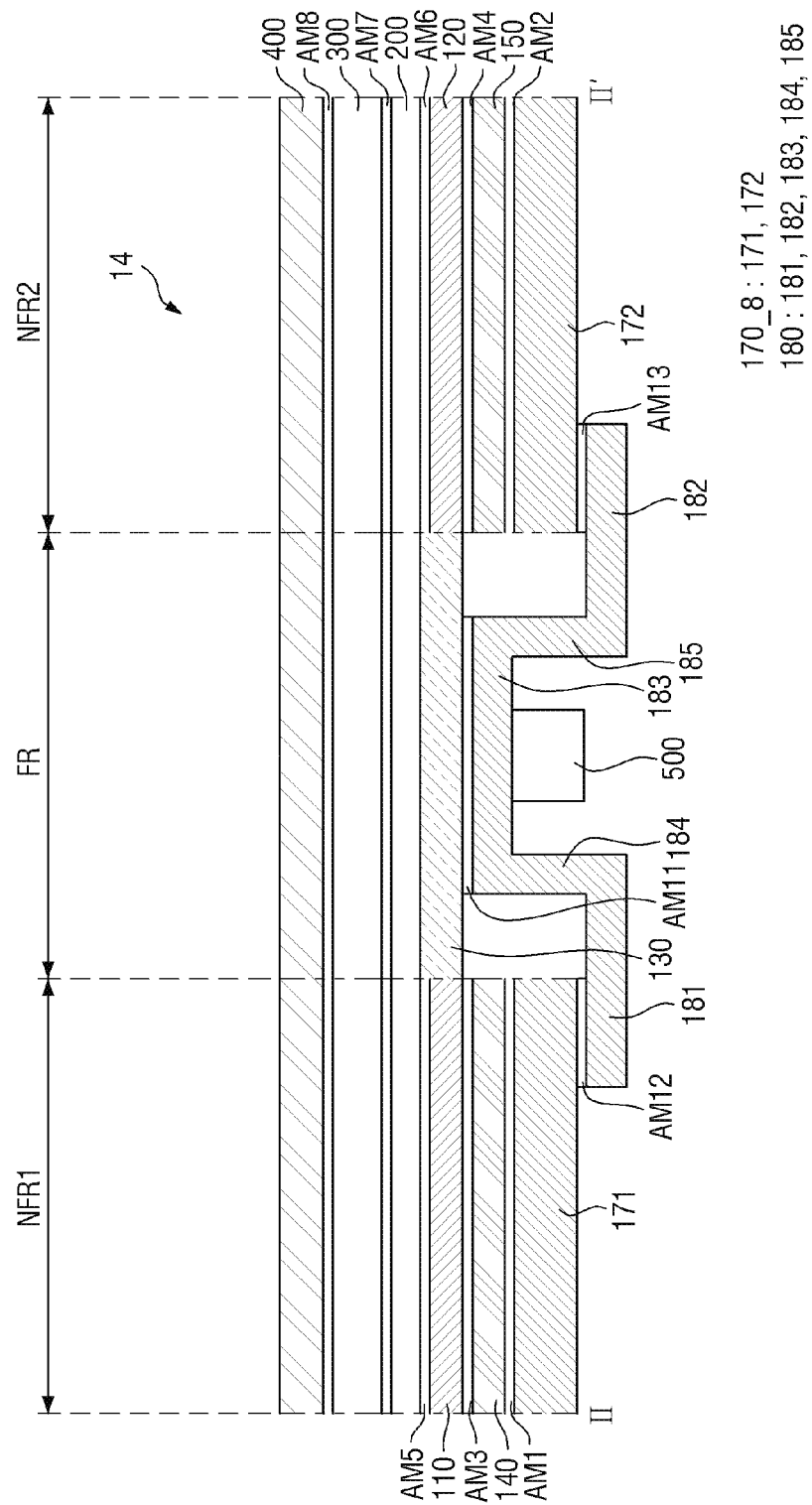

DISPLAY DEVICE

CROSS-REFERENCE TO RELATED APPLICATIONS

This application claims priority under 35 U.S.C. § 119 to Korean Patent Application No. 10-2019-0080852, filed on Jul. 4, 2019 in the Korean Intellectual Property Office, the disclosure of which is incorporated by reference herein in its entirety.

TECHNICAL FIELD

The present invention relates to a display device, and more particularly, to a display device which is switchable between a folded state and an unfolded state.

DISCUSSION OF THE RELATED ART

A display device is a device for displaying an image, and includes a display panel such as, for example, an organic light emitting diode (OLED) display panel or a liquid crystal display (LCD) panel.

A mobile electronic device, such as a smartphone, includes a display device for providing an image to a user. As the size of mobile electronic devices increases, a foldable display device or a bendable display device having a structure that can be folded and unfolded to provide a larger screen only at the time of use has been developed.

SUMMARY

An exemplary embodiment of the present invention provides a display device in which deformation due to pressure occurring when pressing a fingerprint sensor in a folding region of the display device is improved.

According to an exemplary embodiment, a display device includes a display panel disposed in a first non-folding region, a second non-folding region, and a folding region, in which the folding region is between the first non-folding region and the second non-folding region. The display device further includes a first buffer member disposed on one surface of the display panel in the first non-folding region, a second buffer member disposed on the one surface of the display panel in the second non-folding region, and a metal layer disposed in the first non-folding region, the second non-folding region, and the folding region on one surface of the first buffer member and one surface of the second buffer member. The display device further includes a fingerprint sensor disposed on the metal layer. The first buffer member and the second buffer member are separated from each other with the folding region therebetween. The metal layer includes a first metal portion located in the first non-folding region, a second metal portion located in the second non-folding region, and a third metal portion located in the folding region. The fingerprint sensor is attached to the third metal portion.

In an exemplary embodiment, the display device further includes a first support member disposed on the one surface of the display panel in the first non-folding region, and a second support member disposed on the one surface of the display panel in the second non-folding region. The first support member is disposed between the display panel and the first buffer member, and the second support member is disposed between the display panel and the second buffer member.

In an exemplary embodiment, the first support member and the second support member are separated from each other with the folding region therebetween.

In an exemplary embodiment, the third metal portion is located closer to the display panel as compared with the first metal portion and the second metal portion.

In an exemplary embodiment, the display device further includes a light blocking pattern disposed between the third metal portion and the display panel in the folding region. The light blocking pattern includes an opaque material.

In an exemplary embodiment, the metal layer further includes a fourth metal portion connecting the third metal portion and the first metal portion, and a fifth metal portion connecting the third metal portion and the second metal portion.

In an exemplary embodiment, the fourth metal portion is in contact with the first buffer member, and the fifth metal portion is in contact with the second buffer member.

In an exemplary embodiment, the third metal portion extends to a boundary between the folding region and the first non-folding region and a boundary between the folding region and the second non-folding region.

In an exemplary embodiment, the fingerprint sensor is spaced apart from the light blocking pattern with the third metal portion therebetween.

In an exemplary embodiment, the display device further includes a first adhesive member disposed between the light blocking pattern and the third metal portion, a second adhesive member disposed between the first support member and the first buffer member, and a third adhesive member disposed between the second support member and the second buffer member. The first adhesive member has a higher strength than each of the second adhesive member and the third adhesive member.

In an exemplary embodiment, the fingerprint sensor is disposed between the third metal portion and the light blocking pattern.

In an exemplary embodiment, the light blocking pattern includes an opening in a region overlapping the third metal portion, and the third metal portion is disposed in the opening of the light blocking pattern.

In an exemplary embodiment, the first non-folding region and the second non-folding region overlap each other in a thickness direction when the folding region is folded.

In an exemplary embodiment, the display device further includes a window disposed on another surface of the display panel which opposes the one surface of the display panel, and an upper functional member disposed between the display panel and the window. The upper functional member includes at least one of a polarization layer, a touch sensing layer, and an anti-reflective layer.

In an exemplary embodiment, the fingerprint sensor is an ultrasonic fingerprint sensor or an optical fingerprint sensor.

According to an exemplary embodiment of the present invention, a display device includes a display panel disposed in a first non-folding region, a second non-folding region, and a folding region, in which the folding region is between the first non-folding region and the second non-folding region. The display device further includes a first buffer member disposed on one surface of the display panel and in the first non-folding region, and a second buffer member disposed on the one surface of the display panel and in the second non-folding region. The display device further includes a first metal layer overlapping the first buffer member and spaced apart from the display panel with the first buffer member therebetween, and a second metal layer overlapping the second buffer member and spaced apart from the display panel with the second buffer member therebetween. The display device further includes a metal sheet including a first metal sheet portion located in the first non-folding region, a second metal sheet portion located in the second non-folding region, and a third metal sheet portion located in the folding region. The display device further includes a fingerprint sensor attached to the third metal sheet portion of the metal sheet. The first buffer member and the second buffer member are separated from each other with the folding region therebetween. The first metal layer and the second metal layer are separated from each other with the folding region therebetween.

In an exemplary embodiment, the third metal sheet portion is located closer to the display panel as compared with the first metal sheet portion and the second metal sheet portion.

In an exemplary embodiment, the display device further includes a light blocking pattern disposed between the third metal sheet portion and the display panel in the folding region. The light blocking pattern includes an opaque material.

In an exemplary embodiment, the metal sheet further includes a fourth metal sheet portion connecting the third metal sheet portion and the first metal sheet portion, and a fifth metal sheet portion connecting the third metal sheet portion and the second metal sheet portion.

In an exemplary embodiment, the first metal sheet portion is attached to the first metal layer, the second metal sheet portion is attached to the second metal layer, and the third metal sheet portion is attached to the light blocking pattern.

BRIEF DESCRIPTION OF THE DRAWINGS

The above and other aspects and features of the present invention will become more apparent by describing in detail exemplary embodiments thereof with reference to the accompanying drawings, in which:

FIG. 19 is a cross-sectional view of a display device according to an exemplary embodiment.

DETAILED DESCRIPTION OF THE EXEMPLARY EMBODIMENTS

Figure 1:
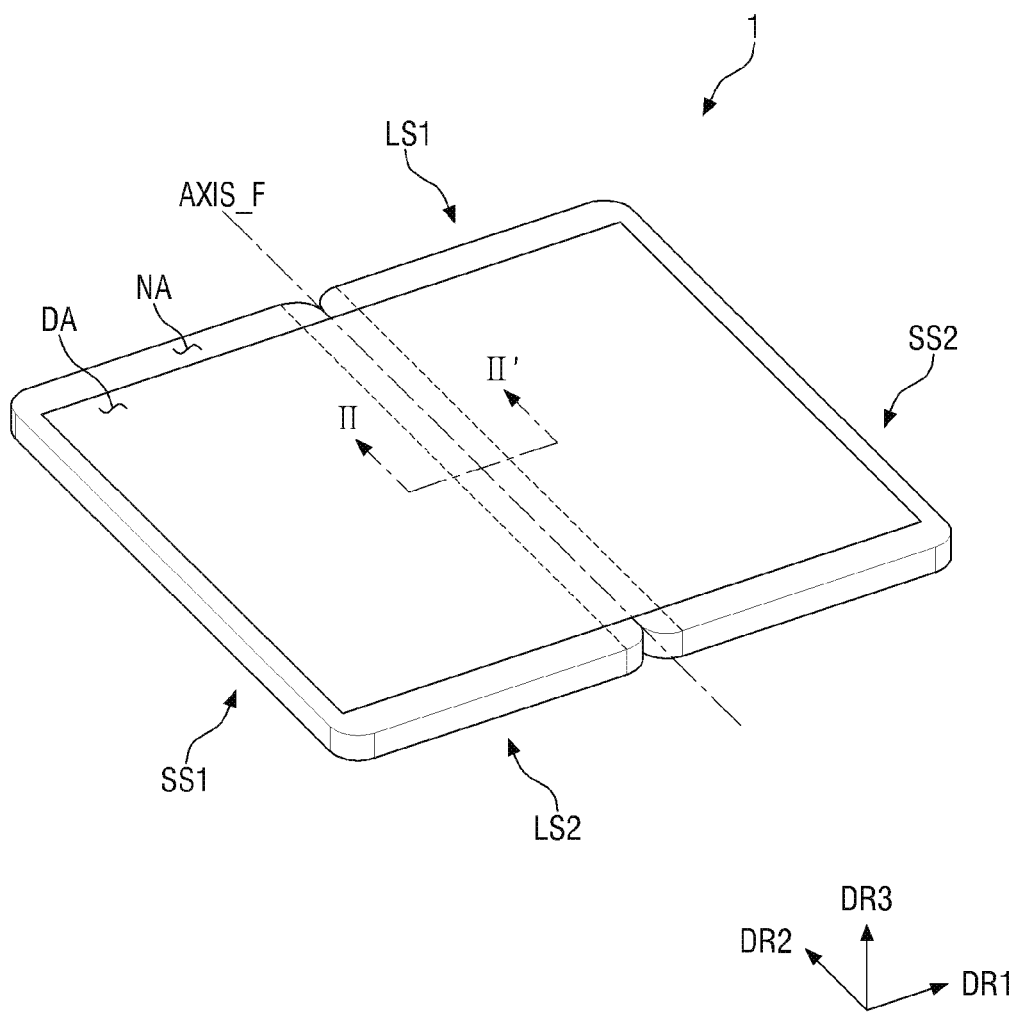
FIG. 1 is a perspective view of a display device according to an exemplary embodiment.

Exemplary embodiments of the present invention will be described more fully hereinafter with reference to the accompanying drawings. Like reference numerals may refer to like elements throughout the accompanying drawings.

It will be understood that when an element is referred to as being related to another element such as being "coupled" or "connected" to another element, it can be directly coupled or connected to the other element, or intervening elements may be present therebetween. Other expressions that explain the relationship between elements, such as, for example, "between" or "adjacent to," should be construed in the same way.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Figure 2:
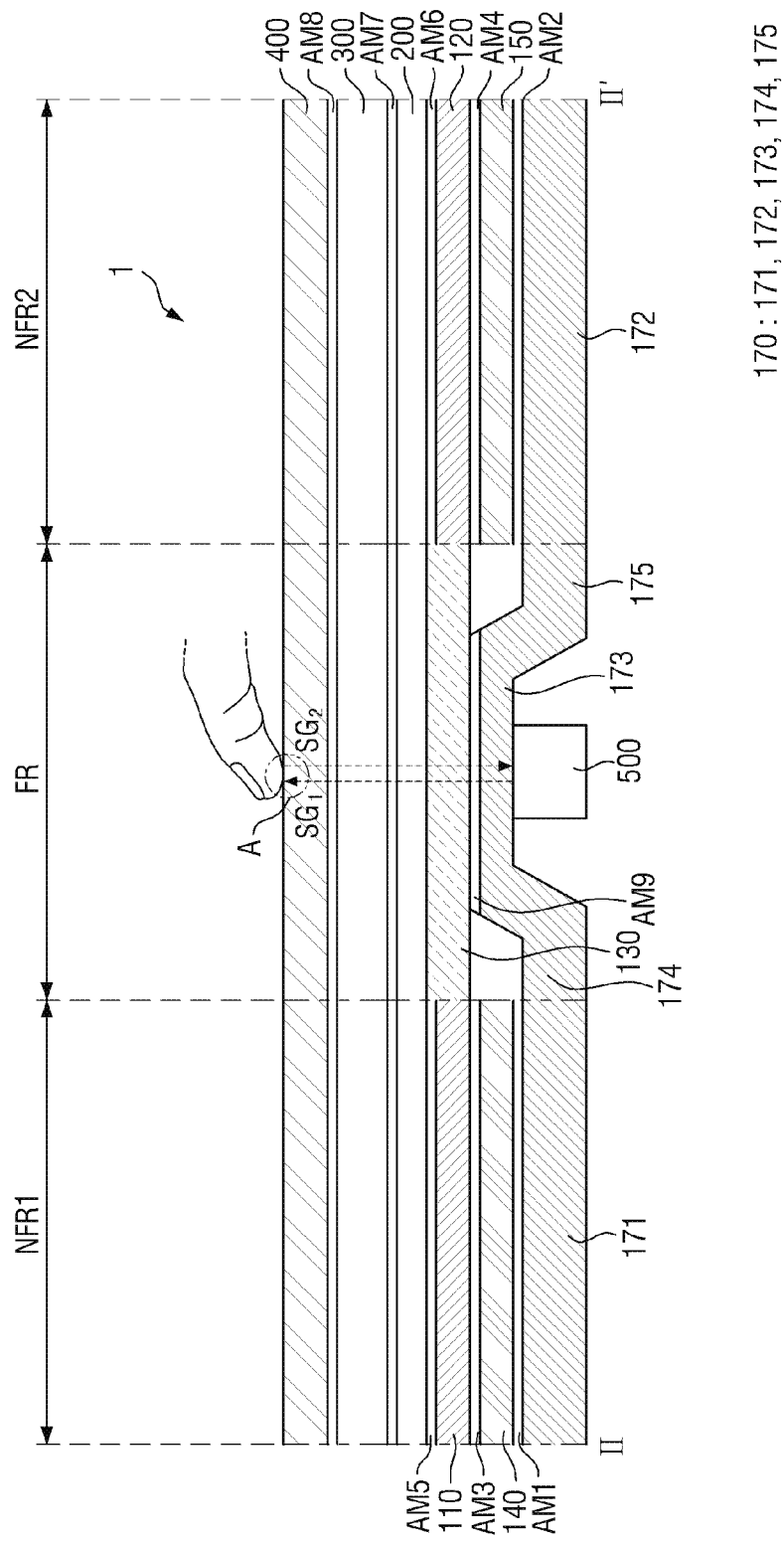
FIG. 2 is a cross-sectional view taken along line II-IF of FIG. 1 according to an exemplary embodiment.
Figure 3:
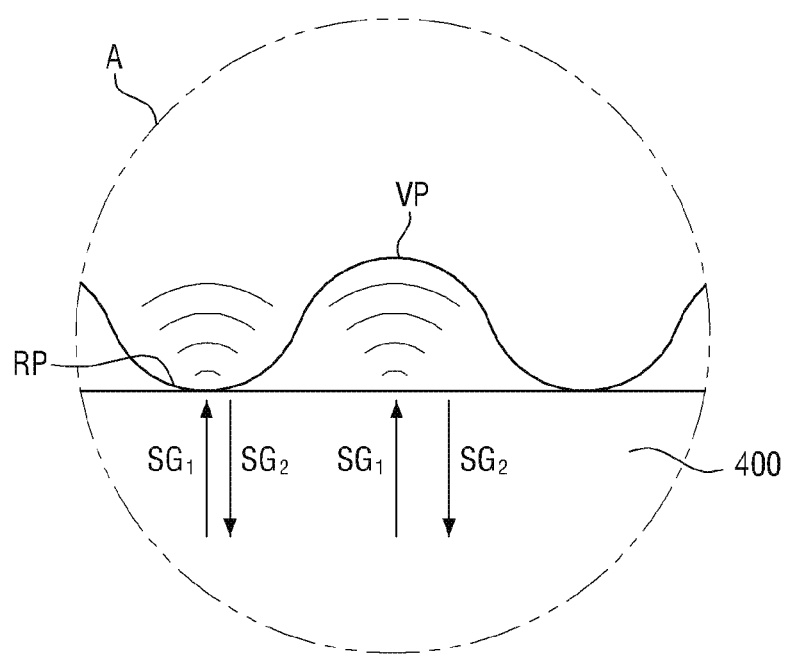
FIG. 3 is an enlarged view of area A of FIG. 2 according to an exemplary embodiment.
Figure 4:
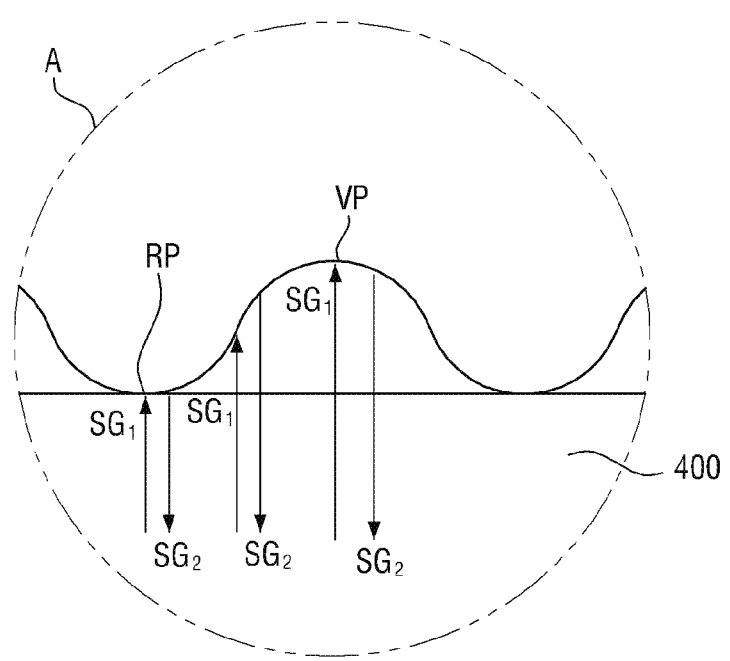
FIG. 4 is an enlarged view of area A of FIG. 2 according to an exemplary embodiment.
Figure 5:
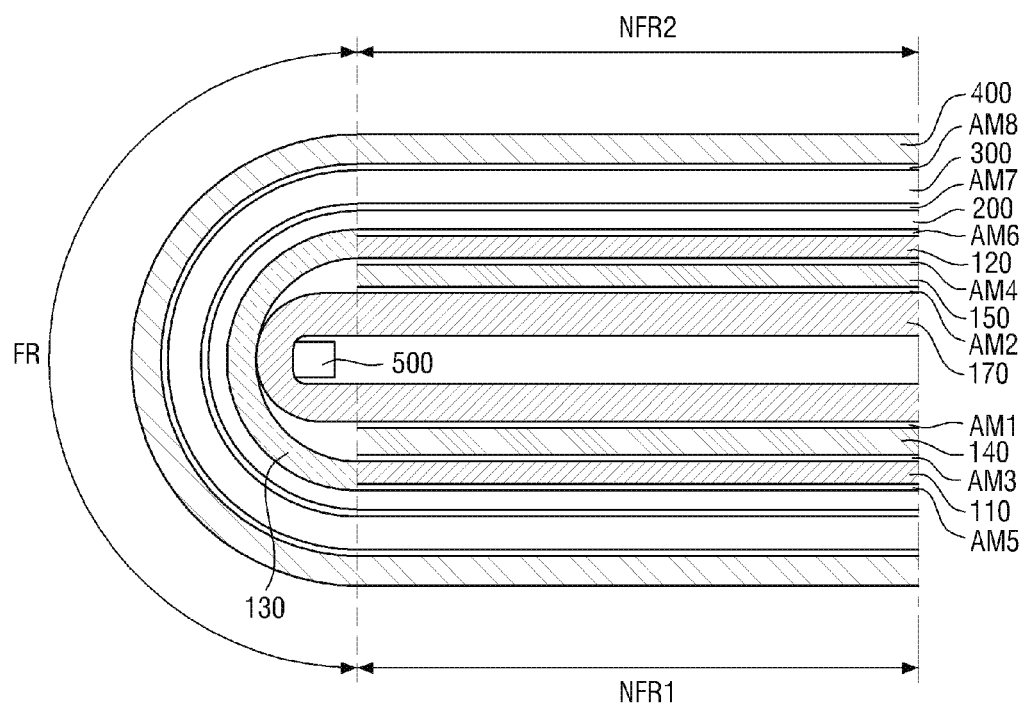
FIG. 5 is a cross-sectional view illustrating a display device in a folded state according to an exemplary embodiment.

FIG. 1 is a perspective view of a display device according to an exemplary embodiment. FIG. 2 is a cross-sectional view taken along line II-II' of FIG. 1 according to an exemplary embodiment. FIG. 3 is an enlarged view of area A of FIG. 2 according to an exemplary embodiment. FIG. 4 is an enlarged view of area A of FIG. 2 according to an exemplary embodiment. FIG. 5 is a cross-sectional view illustrating a display device in a folded state according to an exemplary embodiment.

Referring to FIGS. 1 to 5, a display device 1 may be a flexible display device. As used herein, the term "foldable" may refer to a flexible state, and includes both a bendable state and a rollable state. Furthermore, the term "folding" should be interpreted as including both "partially" folding, "entirely" folded, "in" folding, and "out" folding.

The display device 1 may include a folding axis AXIS_F that traverses the upper and lower sides of the display device in a plan view. The display device may be folded based on the folding axis AXIS_F.

The display device 1 may have a substantially planar rectangular shape. The display device 1 may have a rectangular shape having vertically planar edges or a rectangular shape having rounded edges. The display device 1 may include four edges LS1, LS2, SS1, and SS2. The display device 1 may include long-side edges LS1 and LS2 and short-side edges SS1 and SS2. For example, the long-side edges LS1 and LS2 may extend in a first direction DR1, and the short-side edges SS1 and SS2 may extend in a second direction DR2.

As shown in FIG. 1, the folding axis AXIS_F may extend in a direction traversing the long-side edges LS1 and LS2, for example, in the second direction DR2. In this case, the long-side edges LS1 and LS2 of the display device 1 may be folded. Unlike the exemplary embodiment illustrated in FIG. 1, in an exemplary embodiment, the folding axis AXIS_F may extend to traverse the short-side edges SS1 and SS2. In this case, the short-side edges SS1 and SS2 of the display device 1 may be folded. Hereinafter, for convenience of explanation, the present invention will be primarily described based on a case in which the folding axis AXIS_F extends to traverse the long-side edges LS1 and LS2. The folding axis AXIS_F may traverse the center portion of each of the long-side edges LS1 and LS2. However, the present invention is not limited thereto.

As used herein, the terms "upper portion" and "upper surface" in the thickness direction refer to a display direction, and the terms "lower portion" and "lower surface" refer to a direction opposite to the display direction, unless otherwise defined. In addition, the terms "upper", "lower", "left", and "right" in the plan view represent directions when viewed from the top based on the display surface at a correct position.

The display device 1 may include a display area DA and a non-display area NA disposed around the display area DA. The display area DA is an area in which an image is displayed, and the non-display area NA is an area in which an image is not displayed. The non-display area NA may correspond to a bezel of the display device 1. The display area DA may be located at the center of the display device 1. In a state in which the display device 1 is folded, in the display area DA, regions divided by the folding axis AXIS_F may overlap each other, and in a state in which the display device 1 is unfolded, in the display area DA, an image may be displayed in a state in which the respective regions are unfolded.

A groove (for example, a notch) recessed downward/upward on the plane is formed in a region adjacent to the first long-side edge LS1 and second long-side edge LS2 of the display device 1, each meeting the folding axis AXIS_F, and a hinge member utilized when switching between a folded state and an unfolded state may be coupled to the recessed portion. However, the present invention is not limited thereto.

Referring to FIG. 2, the display device 1 may be divided into a folding region FR and non-folding regions NFR1 and NFR2 based on the folding axis AXIS_F.

For example, the display device 1 may include a folding region FR located at the center of the display device and including the folding axis AXIS_F, and non-folding regions NFR1 and NFR2 spaced apart from each other with the folding region therebetween.

The folding region FR is a region in which the display device 1 is capable of being folded or bent with a predetermined curvature in the folding direction, and the non-folding regions NFR1 and NFR2, unlike the folding region FR, are regions in which the display device 1 is not capable of being folded or bent. Each of the non-folding regions NFR1 and NFR2 may be a flat region located on the same plane, or may be a partially bent region.

As shown in FIG. 2, the display device 1 may include a plurality of laminated members. For example, the display device 1 may include a display panel 200, an upper functional layer 300 disposed on the display panel 200, and a window 400 disposed on the upper functional layer 300. The display panel 200, the upper functional member 300, and the window 400 may be disposed in the first non-folding region NFR1, the second non-folding region NFR2, and the folding region FR.

The display device 1 according to an exemplary embodiment may further include other components disposed under the display panel 200. For example, as shown in FIG. 2, the display device 1 may further include support members 110 and 120 disposed under the display panel 200, buffer members 140 and 150 disposed under the support members 110 and 120, a metal layer 170 disposed under the buffer members 140 and 150, and a light blocking pattern 130 disposed between the first support member 110 and the second support member 120. The buffer members 140 and 150 may be spaced apart from the display panel 200 with the support members 110 and 120 interposed therebetween, respectively. For example, the first buffer member 140 may be disposed on one surface (e.g., the bottom surface) of the display panel 200 in the first non-folding region NFR1 with the first support member 110 interposed therebetween, and the second buffer member 150 may be disposed on one surface (e.g., the bottom surface) of the display panel 200 in the second non-folding region NFR2 with the second support member 120 disposed therebetween. The display device 1 according to an exemplary embodiment may further include a fingerprint sensor 500 disposed on the metal layer 170. The fingerprint sensor 500 may overlap the folding region FR, and may be attached to the metal layer 170.

The first support member 110 may be disposed in the first non-folding region NFR1, and the second support member 120 may be disposed in the second non-folding region NFR2. In an exemplary embodiment, the support members 110 and 120 are not disposed in the folding region FR. For example, the first support member 110 and the second support member 120 may be spaced apart from each other with the folding region FR interposed therebetween.

The inner side surfaces of the support members 110 and 120 may be aligned with a boundary between the first non-folding region NFR1 and the folding region FR and a boundary between the second non-folding region NFR2 and the folding region FR, respectively. However, the present invention is not limited thereto. For example, in an exemplary embodiment, the inner side surfaces of the support members 110 and 120 may be inside the boundary between the first non-folding region NFR1 and the folding region FR and the boundary between the second non-folding region NFR2 and the folding region FR, respectively.

The first buffer member 140 may be disposed in the first non-folding region NFR1, and the second buffer member 150 may be disposed in the second non-folding region NFR2. In an exemplary embodiment, the buffer members 140 and 150 are not disposed in the folding region. For example, the first buffer member 140 and the second buffer member 150 may be spaced apart from each other with the folding region FR interposed therebetween.

The inner side surfaces of the buffer members 140 and 150 may be aligned with a boundary between the first non-folding region NFR1 and the folding region FR and a boundary between the second non-folding region NFR2 and the folding region FR, respectively. However, the present invention is not limited thereto. For example, in an exemplary embodiment, the inner side surfaces of the buffer members 140 and 150 may be inside the boundary between the first non-folding region NFR1 and the folding region FR and the boundary between the second non-folding region NFR2 and the folding region FR, respectively.

The inner side surfaces of the buffer members 140 and 150 may be aligned with the inner side surfaces of the support members 110 and 120 in a thickness direction. However, the present invention is not limited thereto.

The light blocking pattern 130 may be disposed in a space between the support members 110 and 120. The light blocking pattern 130 may be disposed in the folding region FR, and may be disposed on the bottom surface (or one surface) of the display panel 200. The light blocking pattern 130 may completely overlap the folding region FR along the first direction DR1. For example, the width of the light blocking pattern 130 in the first direction DR1 may be about equal to the width of the folding region FR in the first direction DR1. However, the present invention is not limited thereto. For example, in an exemplary embodiment, the light blocking pattern 130 may be located inside the boundary between the folding region FR and the first non-folding region NFR1 and the boundary between the folding region FR and the second non-folding region NFR2, and may expose a portion of the folding region adjacent to the non-folding regions NFR1 and NFR2 on the bottom surface (or one surface) of the display panel 200.

The metal layer 170 may be disposed in the non-folding regions NFR1 and NFR2 and the folding region FR.

The display device 1 according to an exemplary embodiment may include a plurality of adhesive films AM1 to AM9 that attach the aforementioned members to each other therebetween. The first adhesive film AM1 may be disposed between the metal layer 170 and the first buffer member 140 to attach the metal layer 170 and the first buffer member 140 to each other. The second adhesive film AM2 may disposed between the metal layer 170 and the second buffer member 150 to attach the metal layer 170 and the second buffer member 150 to each other. The third adhesive film AM3 may be disposed between the first buffer member 140 and the first support member 110 to attach the first buffer member 140 and the first support member 110 to each other. The fourth adhesive film AM4 may be disposed between the second buffer member 150 and the second support member 120 to attach the second buffer member 150 and the second support member 120 to each other. The fifth adhesive film AM5 may be disposed between the first support member 110 and the display panel 200 to attach the first support member 110 and the display panel 200 to each other. The sixth adhesive film AM6 may be disposed between the second support member 120 and the display panel 200 to attach the second support member 120 and the display panel 200 to each other. The seventh adhesive film AM7 may be disposed between the display panel 200 and the upper functional member 300 to attach the display panel 200 and the upper functional member 300 to each other. The eighth adhesive film AM8 may be disposed between the upper functional member 300 and the window 400 to attach the upper functional member 300 and the window 400 to each other. The ninth adhesive film AM9 may be disposed between the metal layer 170 and the light blocking pattern 130 to attach the metal layer 170 and the light blocking pattern 130 to each other.

The plurality of adhesive films AM1 to AM9 may be films having adhesive properties on both upper and lower surfaces thereof, and examples thereof may include a pressure-sensitive adhesive (PSA) film, an optical clear adhesive (OCA) film, and an optical clear resin (OCR) film. The adhesive film may include acrylic resin or silicone resin. The adhesive film may have an elongation rate of 100% to 1,000%.

The display panel 200 may display an image produced by an input data signal. The display panel 200 may include, for example, an organic light emitting diode (OLED) display panel, a liquid crystal display (LCD) panel, a plasma display panel, an electrophoretic display panel, an electrowetting display panel, a quantum dot light emitting display panel, or a micro light emitting diode (LED) display panel. In exemplary embodiments described herein, the display panel 200 is an OLED display panel.

The display panel 200 may include a flexible substrate including a flexible polymer material such as, for example, polyimide (PI). Accordingly, the display panel 200 may be bent, warped, folded, or rolled. The display panel 200 may have a shape similar to the planar shape of the display device 1.

A plurality of pixels may be arranged in the display area DA of the display panel 200, and signal lines and drive circuits for applying signals to the respective pixels may be arranged in the non-display area NA of the display panel 200. Further, the non-display area NA may be provided with a black matrix having a shape of a rectangular frame in a plan view.

Each pixel may include a light emitting layer and a circuit layer for controlling the amount of light emitted from the light emitting layer. The circuit layer may include a plurality of signal lines, a plurality of electrodes, and at least one transistor. In an exemplary embodiment, the light emitting layer may include an organic light emitting material. The light emitting layer may be encapsulated by an encapsulation film. The encapsulation film may encapsulate the light emitting layer to prevent moisture from entering the pixel.

The encapsulation film may be, for example, an inorganic single-layer film or an inorganic multi-layer film, or may be a laminated film in which inorganic films and organic films are alternately laminated.

The upper functional member 300 may be disposed on the display panel 200.

The upper functional member 300 may include at least one functional layer. The functional layer may be a layer that performs, for example, a touch sensing function, a color filtering function, a color conversion function, a polarization function, an anti-reflection function, or a biometric information recognition function (for example, a fingerprint recognition function). The upper functional member 300 may include, for example, an anti-reflection member. The functional layer may be, for example, a sheet layer, a film layer, a thin film layer, a coating layer, a panel, or a plate. The upper functional member 300 may be formed of one single functional layer. However, the present invention is not limited thereto. For example, in an exemplary embodiment, and the upper functional member 300 may be a laminate of different functional layers.

The window 400 may be disposed on the upper functional member 300.

The window 400 covers and protects the underlying members 100, 200, and 300. The window 400 may be made of, for example, glass or quartz. The thickness of the window 400 may be less than about 100 μm. When the thickness of the window 400 is small, stress is reduced at the time of folding, which may prevent or reduce the likelihood of deformation even if a folded state and an unfolded state are repeated. In an exemplary embodiment, the window may include chemically reinforced ultrathin glass (UTG).

The support members 110 and 120 may serve to support the display panel 200. The support members 110 and 120 may include a metal material such as, for example, stainless steel (SUS) or aluminum, or a polymer material such as, for example, polymethyl metacrylate (PMMA), polycarbonate (PC), polyvinylalcohol (PVA), acrylonitirle-butadiene-styrene (ABS), or polyethylene terephthalate (PET). For example, the support members 110 and 120 may include, but are not limited to, polyimide (PI).

The buffer members 140 and 150 may prevent an impact applied from the outside (for example, an impact applied in a downward direction of the display device 1) from being transmitted to the display panel 200. The buffer members 140 and 150 may include a foam material such as, for example, polyurethane (PU), thermoplastic polyurethane (TPU), silicon (Si), or polydimethylacrylamide (PDMA).

In the display device 1 according to an exemplary embodiment, the support members 110 and 120 and the buffer members 140 and 150 are spaced apart from each other with the folding region FR interposed therebetween, and thus, the display device 1 may be more easily folded with respect to the folding region FR. For example, the display device 1 may have bending flexibility.

Further, as will be described later, in a comparative example, when a user's finger is in contact with the surface of the window 400 and the fingerprint sensor 500 is operated, the sensitivity of the fingerprint sensor 500 may be deteriorated due to the configuration between the fingerprint sensor 500 and the user's finger. In contrast, in an exemplary embodiment, due in part to the support members 110 and 120 and the buffer members 140 and 150 being spaced apart from each other with the folding region FR interposed therebetween, deterioration of the sensitivity of the fingerprint sensor 500 may be prevented (e.g., due in part to the configuration between the fingerprint sensor 500 and the user's finger).

The light blocking pattern 130 may be disposed between the metal layer 170 and the display panel 200, and may prevent the space (folding region FR) formed between the support members 110 and 120 and the buffer members 140 and 150 from being visually recognized by a user. For this purpose, the light blocking pattern 130 may include an opaque material. For example, the opaque material may be an organic material including a black pigment or dye, or a metal material. The light blocking pattern 130 according to an exemplary embodiment may include an organic material including a black pigment or a dye.

The metal layer 170 may include a metal having rigidity, and may support the bottom of the display device 1. The metal layer 170 may include at least one of, for example, stainless steel and aluminum. However, the material of the metal layer 170 is not limited thereto.

The metal layer 170 may include a first metal portion 171 disposed in the first non-folding region NFR1, a second metal portion 172 disposed in the second non-folding region NFR2, and a third metal portion 173 disposed in the folding region FR. The first metal portion 171 may overlap the first non-folding region NFR1, and may have a shape in which a part thereof extends to the folding region FR. The second metal portion 172 may overlap the second non-folding region NFR2, and may have a shape in which a part thereof extends to the folding region FR. The third metal portion 173 may be located at about the center of the folding region FR, and the width thereof may be smaller than the width of the folding region FR.

The first metal portion 171 may be attached to the first buffer member 140 through the first adhesive film AM1. The second metal portion 172 may be attached to the second buffer member 150 through the second adhesive film AM2. The third metal portion 173 may be attached to the light blocking pattern 130 through the ninth adhesive film AM9. Since the third metal portion 173 is disposed in the space between the support members 110 and 120 and the buffer members 140 and 150, the third metal portion 173 may be located closer to the display panel 200 as compared with the adjacent first metal portion 171 and second metal portion 172. For example, a distance between the display panel 200 and the third metal portion 173 may be less than a distance between the display panel 200 and the first metal portion 171, and the distance between the display panel 200 and the third metal portion 173 may also be less than a distance between the display panel 200 and the second metal portion 172.

The metal layer 170 may further include a fourth metal portion 174 connecting the first metal portion 171 and the third metal portion 173, and a fifth metal portion 175 connecting the second metal portion 172 and the third metal portion 173. For example, the metal layer 170 may be integrally formed over the non-folding regions NFR1 and NFR2 and the folding region FR.

As shown in FIG. 2, the first metal portion 171 to the third metal portion 173 may have a linear cross-sectional shape along the first direction DR1, and the fourth metal portion 174 and the fifth metal portion 175 may have a linear cross-sectional shape along a direction between the first direction DR1 and the third direction DR3. For example, the fourth metal portion 174 may extend from the first metal portion 171 to the third metal portion 173 in a right upward direction, and the fifth metal portion 175 may extend from the second metal portion 172 to the third metal portion 173 in a left upward direction.

The fourth metal portion 174 and the fifth metal portion 175 may be spaced apart from the inner side surfaces of the adjacent buffer members 140 and 150 and support members 110 and 120, respectively. For example, the fourth metal portion 174 and the fifth metal portion 175 may be spaced apart from the inner side surfaces of the adjacent buffer members 140 and 150 and support members 110 and 120 with a predetermined space therebetween, respectively.

The fingerprint sensor 500 may be attached to the third metal portion 173. The fingerprint sensor 500 according to an exemplary embodiment may be disposed on the other surface of the third metal portion 173, which is a surface opposite to one surface thereof facing the light blocking pattern 130, and may be attached to the other surface thereof.

The fingerprint sensor 500 according to an exemplary embodiment may be an ultrasonic fingerprint sensor. A first signal $SG_1$ transmitted from the fingerprint sensor 500 and a second signal $SG_2$ transmitted to the fingerprint sensor 500 may be, for example, ultrasonic signals.

For example, as shown in FIGS. 2 and 3, when the fingerprint sensor 500 operates with a user's finger is placed in contact with the surface of the window 400 while applying a predetermined pressure to the surface thereof, the first signal $SG_1$ transmitted from the fingerprint sensor 500 in an upward direction (third direction DR3) is provided to the user's fingerprint formed on the surface of the user's finger through the metal layer 170, the light blocking pattern 130, the display panel 200, the upper functional member 300, and the window 400.

The fingerprint formed on the surface of the user's finger may include a valley portion VP spaced apart from the surface of the window 400 in a thickness direction, and a ridge portion RP which is in contact with the surface of the window 400.

The first signal $SG_1$ provided to the ridge portion RP of the fingerprint and the first signal $SG_1$ provided to the valley portion VP of the fingerprint are converted into second signals $SG_2$ including different position information (for example, distance information) when these first signals $SG_1$ are reflected from the fingerprint (from the ridge portion RP and valley portion VP), and then the converted second signals $SG_2$ are transmitted to the fingerprint sensor 500 through the window 400, the upper functional member 300, the display panel 200, the light blocking pattern 130, and the metal layer 170.

In exemplary embodiments, as shown in FIG. 4, each of the first signal $SG_1$ and the second signal $SG_2$ may be an optical signal. For example, the fingerprint sensor 500 may be an optical fingerprint sensor.

Referring to a comparative example, when the fingerprint sensor 500 is disposed in the folding region FR, and a user applies pressure for fingerprint recognition on the surface of the window 400 located in the folding region FR, the folding region FR of the display device 1 may be recessed in the thickness direction by applying the pressure for fingerprint recognition because the support members 110 and 120 and the buffer members 140 and 150 are not disposed in the folding region FR as described above. Although the upper components disposed in the folding region FR of the display device 1 may be returned to their original position when the application of pressure by the user is completed, if this operation is repeated, the upper components disposed in the folding region FR of the display device 1 may have a shape indented in a downward direction even after the application of pressure by the user is completed. In this case, the appearance of the display device 1 may be poor, or the sensitivity of the fingerprint sensor 500 may be deteriorated. For example, fingerprint sensing may be used to authenticate a device such as a user's smartphone, and thus, may be performed every time the user uses the device. As a result of this repeated application of pressure when the fingerprint sensor 500 is disposed in the folding region FR, in a comparative example, the appearance of the display device 1 may be degraded in the folding region FR (e.g., an indentation may be formed and remain in the folding region FR).

However, in the display device 1 according to an exemplary embodiment, since the metal layer 170 is disposed even in the folding region FR to which the pressure for the user's fingerprint recognition is applied, the depression of the folding region FR of the display device 1 in the thickness direction may be reduced when the user applies the pressure for fingerprint recognition to the surface of the window 400 located in the folding region FR. Thus, according to exemplary embodiments, deterioration of the appearance of the display device 1 and deterioration of the sensitivity of the fingerprint sensor 500 may be reduced.

Hereinafter, a folding operation of the display device 1 according to an exemplary embodiment will be described in detail.

Referring to FIG. 5, the folding region FR of the display device 1 may be folded along a folding direction. For example, the window 400, the upper functional member 300, the display panel 200, and the third metal portion 173 of the metal layer 170 may be folded with a predetermined curvature in the folding region FR by an external force, and are not substantially folded in the non-folding regions NFR1 and NFR2 by external force. For example, the window 400, the upper functional member 300, the display panel 200, and the first metal portion 171 and second metal portion 172 of the metal layer 170 may be located on a substantially flat surface forming the same plane in the non-folding regions NFR1 and NFR2.

Moreover, like the window 400, the upper functional member 300, the display panel 200, and the first metal portion 171 and second metal portion 172 of the metal layer 170 which are located in the non-folding regions NFR1 and NFR2, the support members 110 and 120 which are located only in the non-folding regions NFR1 and NFR2 may also be located on a flat surface forming the same plane.

When an external force is applied to one side of the display device 1, for example, to the left side thereof in the folding direction (downward direction in FIG. 2), the folding region FR may be bent or folded, and the first non-folding region NFR1 may overlap or face the second non-folding region NFR2 while moving or rotating along the folding direction.

Figure 6:
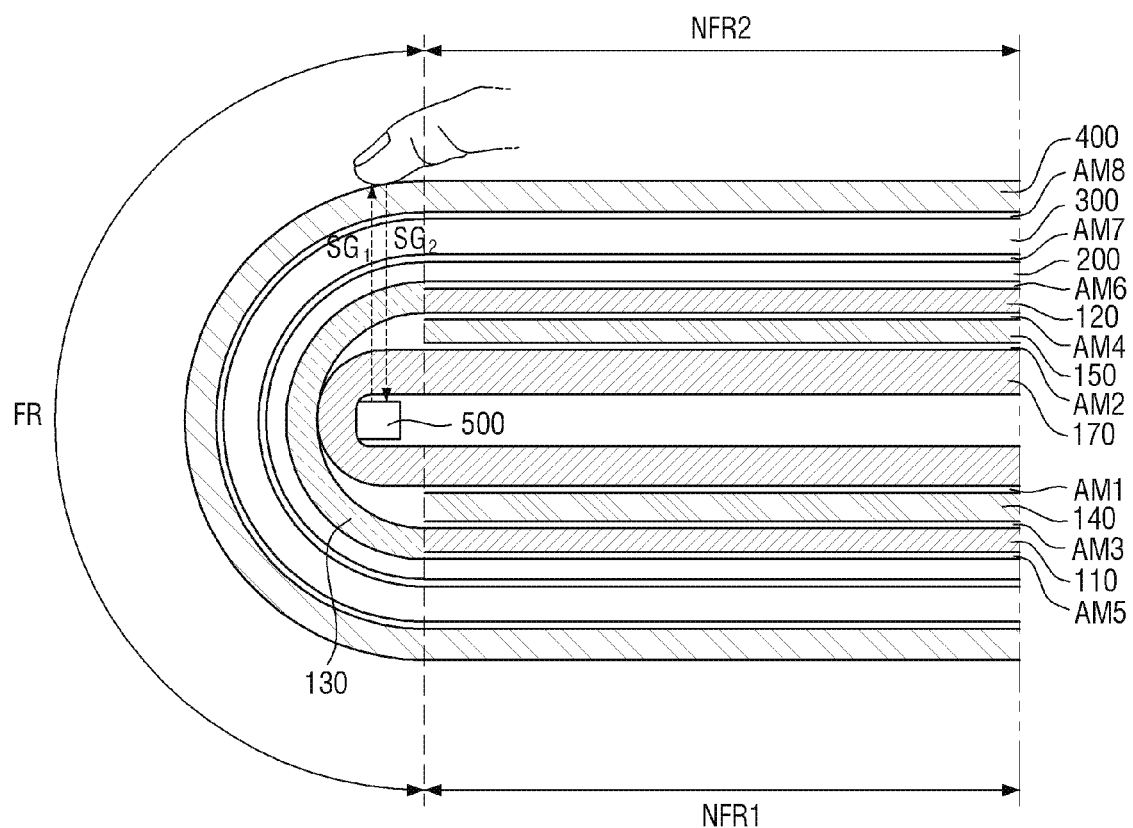
FIG. 6 is a cross-sectional view illustrating a case of pressing a fingerprint sensor in a folded state of the display device according to an exemplary embodiment.

FIG. 6 is a cross-sectional view illustrating a case of pressing a fingerprint sensor in a folded state of the display device according to an exemplary embodiment.

Referring to FIG. 6, as shown in FIG. 5, the fingerprint sensor 500 may be located in the folding region FR adjacent to the non-folding regions NFR1 and NFR2 in a plan view. For example, the user may apply pressure to the folding region FR adjacent to the planar non-folding regions NFR1 and NFR2 to recognize a fingerprint.

As described above, the fingerprint sensor 500 may be an ultrasonic fingerprint sensor. The first signal $SG_1$ transmitted from the fingerprint sensor 500 and the second signal $SG_2$ transmitted to the fingerprint sensor 500 may be ultrasonic signals.

For example, when the fingerprint sensor 500 operates with a user's finger in contact with the surface of the window 400 while applying a predetermined pressure to the surface thereof, the first signal $SG_1$ transmitted from the fingerprint sensor 500 in an upward direction (third direction DR3) is provided to the fingerprint formed on the surface of the user's finger through the metal layer 170, the light blocking pattern 130, the display panel 200, the upper functional member 300, and the window 400.

The fingerprint formed on the surface of the user's finger may include a valley portion VP spaced apart from the surface of the window 400 in a thickness direction, and a ridge portion RP being in contact with the surface of the window 400.

The first signal $SG_1$ provided to the ridge portion RP of the fingerprint and the first signal $SG_1$ provided to the valley portion VP of the fingerprint are converted into second signals $SG_2$ including different position information (for example, distance information) when these first signals SG1 are reflected from the fingerprint (from the ridge portion RP and valley portion VP), and then the converted second signals $SG_2$ are transmitted to the fingerprint sensor 500 through the window 400, the upper functional member 300, the display panel 200, the light blocking pattern 130, and the metal layer 170.

As described above, in the display device 1 according to an exemplary embodiment, the support members 110 and 120 and the buffer members 140 and 150 are spaced apart from each other with the folding region FR interposed therebetween, and thus, the display device 1 may be more easily folded with respect to the folding region FR. For example, the display device 1 may have bending flexibility.

Further, in a comparative example, when a user's finger is in contact with the surface of the window 400 and the fingerprint sensor 500 is operated, the sensitivity of the fingerprint sensor 500 may be deteriorated due to the configuration between the fingerprint sensor 500 and the user's finger. In contrast, in an exemplary embodiment, the support members 110 and 120 and the buffer members 140 and 150 are spaced apart from each other with the folding region FR interposed therebetween, and thus, deterioration of the sensitivity of the fingerprint sensor 500 may be reduced due to the configuration between the fingerprint sensor 500 and the user's finger.

As described above, in a comparative example, when the fingerprint sensor 500 is disposed in the folding region FR and a user applies a pressure for fingerprint recognition to the surface of the window 400 located in the folding region FR, the folding region FR of the display device 1 may be recessed in the thickness direction by applying the pressure for fingerprint recognition because the support members 110 and 120 and the buffer members 140 and 150 are not disposed in the folding region FR as described above. Although the upper components disposed in the folding region FR of the display device 1 may be returned to their original position when the application of pressure by the user is completed, if this operation is repeated many times, which it often is, the upper components disposed in the folding region FR of the display device 1 may have a shape indented in a downward direction even after the application of pressure by the user is completed. In this case, the appearance of the display device 1 may be poor, and/or the sensitivity of the fingerprint sensor 500 may be deteriorated.

However, in the display device 1 according to an exemplary embodiment, since the metal layer 170 is disposed even in the folding region FR to which the pressure for the user's fingerprint recognition is applied, the depression of the folding region FR of the display device 1 in the thickness direction may be reduced when the user applies the pressure for fingerprint recognition to the surface of the window 400 located in the folding region FR. Thus, deterioration of the appearance of the display device 1 and deterioration of the sensitivity of the fingerprint sensor 500 may be reduced.

In the following description, for convenience of explanation, a further description of elements and aspects previously described may be omitted or simplified.

Figure 7:
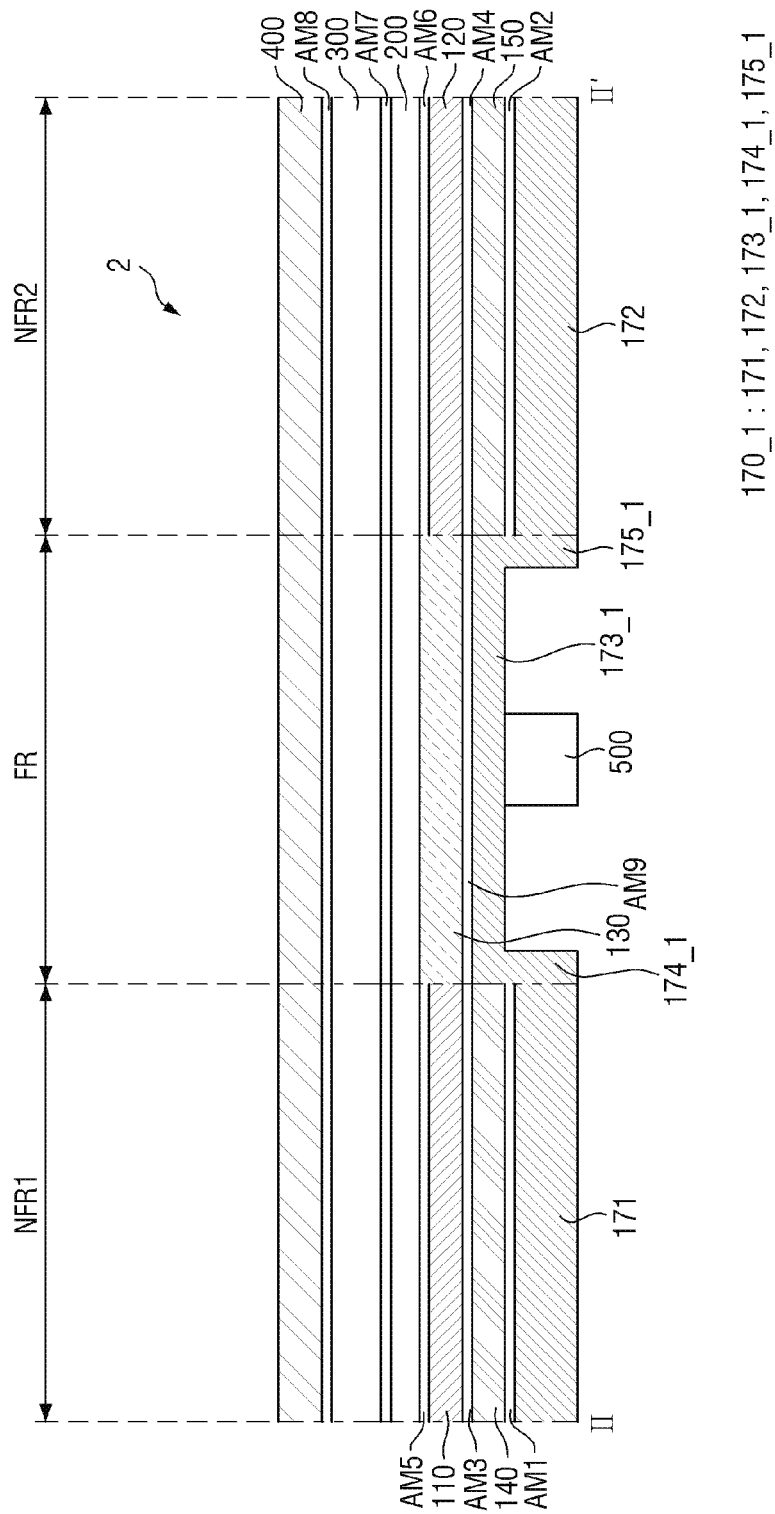
FIG. 7 is a cross-sectional view of a display device according to an exemplary embodiment.

FIG. 7 is a cross-sectional view of a display device according to an exemplary embodiment.

Referring to FIG. 7, a display device 2 according to an exemplary embodiment is different from the display device 1 according to an exemplary embodiment in that the fourth metal portion 174_1 and fifth metal portion 175_1 of a metal layer 170_1 are in contact with the inner side surfaces of the buffer members 140 and 150, respectively.

For example, in the display device 2 according to an exemplary embodiment, the fourth metal portion 174_1 and fifth metal portion 175_1 of the metal layer 170_1 may be in contact with the inner side surfaces of the buffer members 140 and 150, respectively.

The third metal portion 173_1 may be substantially the same as the width of the folding region FR in the first direction DR1. For example, the third metal portion 173_1 may have a shape extending to the boundary between the folding region FR and the non-folding regions NFR1 and NFR2.

The fourth and fifth metal portions 174_1 and 175_1 may have a shape extending vertically along the thickness direction (third direction DR3), unlike the fourth and fifth metal portions 174 and 175 according to FIG. 2.

According to the display device 2 of an exemplary embodiment, since the third metal portion 173_1 has a shape extending to the boundary between the folding region FR and the non-folding regions NFR1 and NFR2, the depression of the folding region FR of the display device 2 in the thickness direction may be reduced when the user applies pressure for fingerprint recognition to the surface of the window 400 located in the folding region FR. Thus, deterioration of the appearance of the display device 2 and deterioration of the sensitivity of the fingerprint sensor 500 may be reduced.

Figure 8:
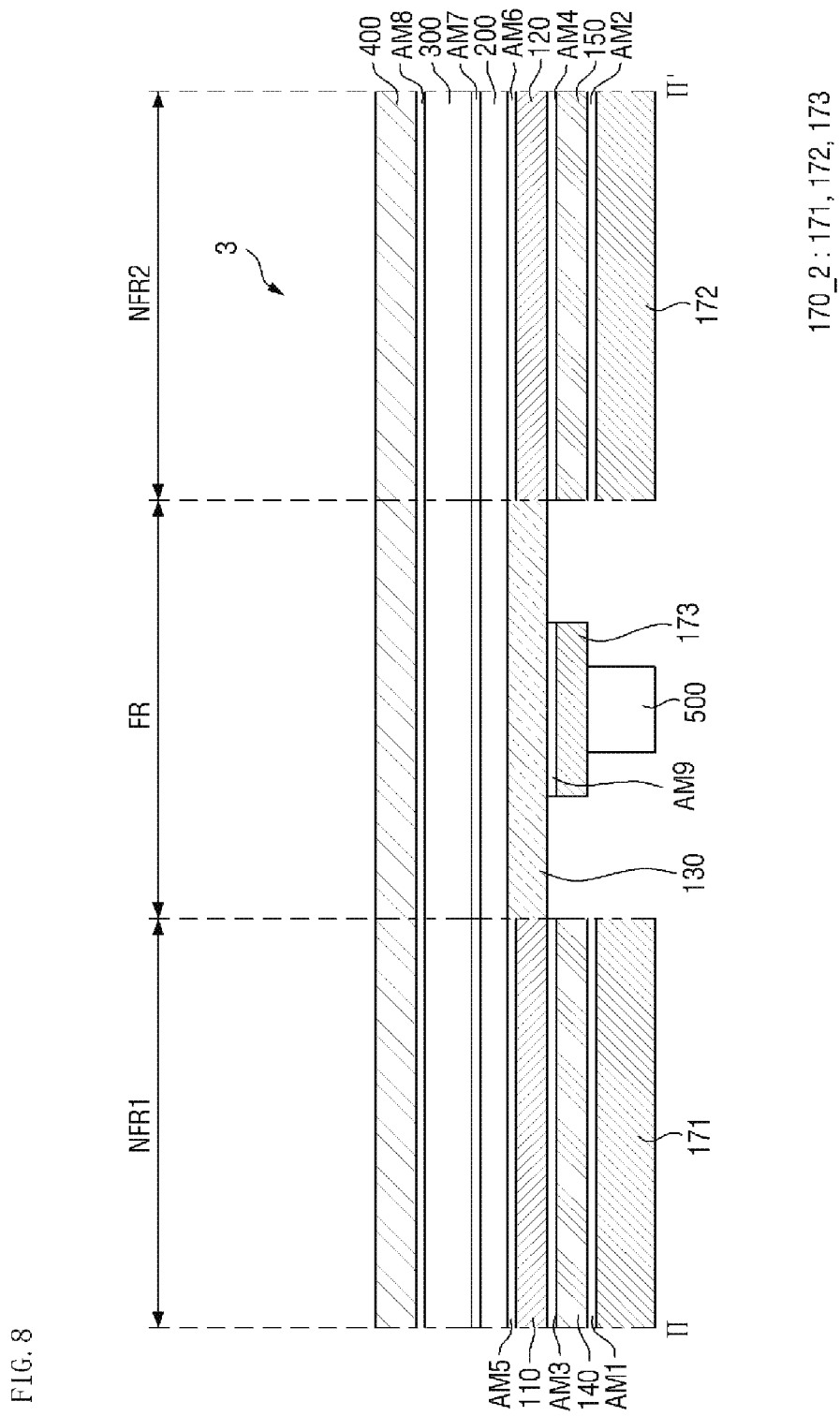
FIG. 8 is a cross-sectional view of a display device according to an exemplary embodiment.

FIG. 8 is a cross-sectional view of a display device according to an exemplary embodiment.

Referring to FIG. 8, a display device 3 according to an exemplary embodiment is different from the display device 1 according to an exemplary embodiment in that the first and second metal portions 171 and 172 adjacent to the third metal portion 173 are spaced apart from each other.

For example, in the display device 3 according to an exemplary embodiment, the first and second metal portions 171 and 172 adjacent to the third metal portion 173 may be spaced apart from each other. For example, the fourth and fifth metal portions 174 and 175 described above with reference to FIG. 2 are omitted, and thus, the metal layer 170-2 may have a plurality of portions spaced apart from each other.

Even in the display device 3 according to an exemplary embodiment, the support members 110 and 120 and the buffer members 140 and 150 are spaced apart from each other with the folding region FR interposed therebetween, and thus, the display device 3 may be more easily folded with respect to the folding region FR. For example, the display device 3 may have bending flexibility.

Further, in a comparative example, when a user's finger is in contact with the surface of the window 400 and the fingerprint sensor 500 is operated, the sensitivity of the fingerprint sensor 500 may be deteriorated due to the configuration between the fingerprint sensor 500 and the user's finger. In contrast, in an exemplary embodiment, the support members 110 and 120 and the buffer members 140 and 150 are spaced apart from each other with the folding region FR interposed therebetween, and thus, deterioration of the sensitivity of the fingerprint sensor 500 may be reduced due to the configuration between the fingerprint sensor 500 and the user's finger.

As described above, when the support members 110 and 120 and the buffer members 140 and 150 are spaced apart from each other with the folding region FR interposed therebetween, the folding region FR of the display device 3 may be recessed in the thickness direction by applying the pressure for fingerprint recognition because the support members 110 and 120 and the buffer members 140 and 150 are not disposed in the folding region FR as described above. Although the upper components disposed in the folding region FR of the display device 3 may be returned to their original position when the application of pressure by the user is completed, if this operation is repeated, the upper components disposed in the folding region FR of the display device 3 may have a shape indented in a downward direction even after the application of pressure by the user is completed. In this case, the appearance of the display device 3 may be poor, and/or the sensitivity of the fingerprint sensor 500 may be deteriorated.

However, in the display device 3 according to an exemplary embodiment, since the metal layer 170_2 is disposed even in the folding region FR to which the pressure for the user's fingerprint recognition is applied, the depression of the folding region FR of the display device 3 in the thickness direction may be reduced when the user applies pressure for fingerprint recognition to the surface of the window 400 located in the folding region FR. Thus, deterioration of the appearance of the display device 3 and deterioration of the sensitivity of the fingerprint sensor 500 may be reduced.

Figure 9:
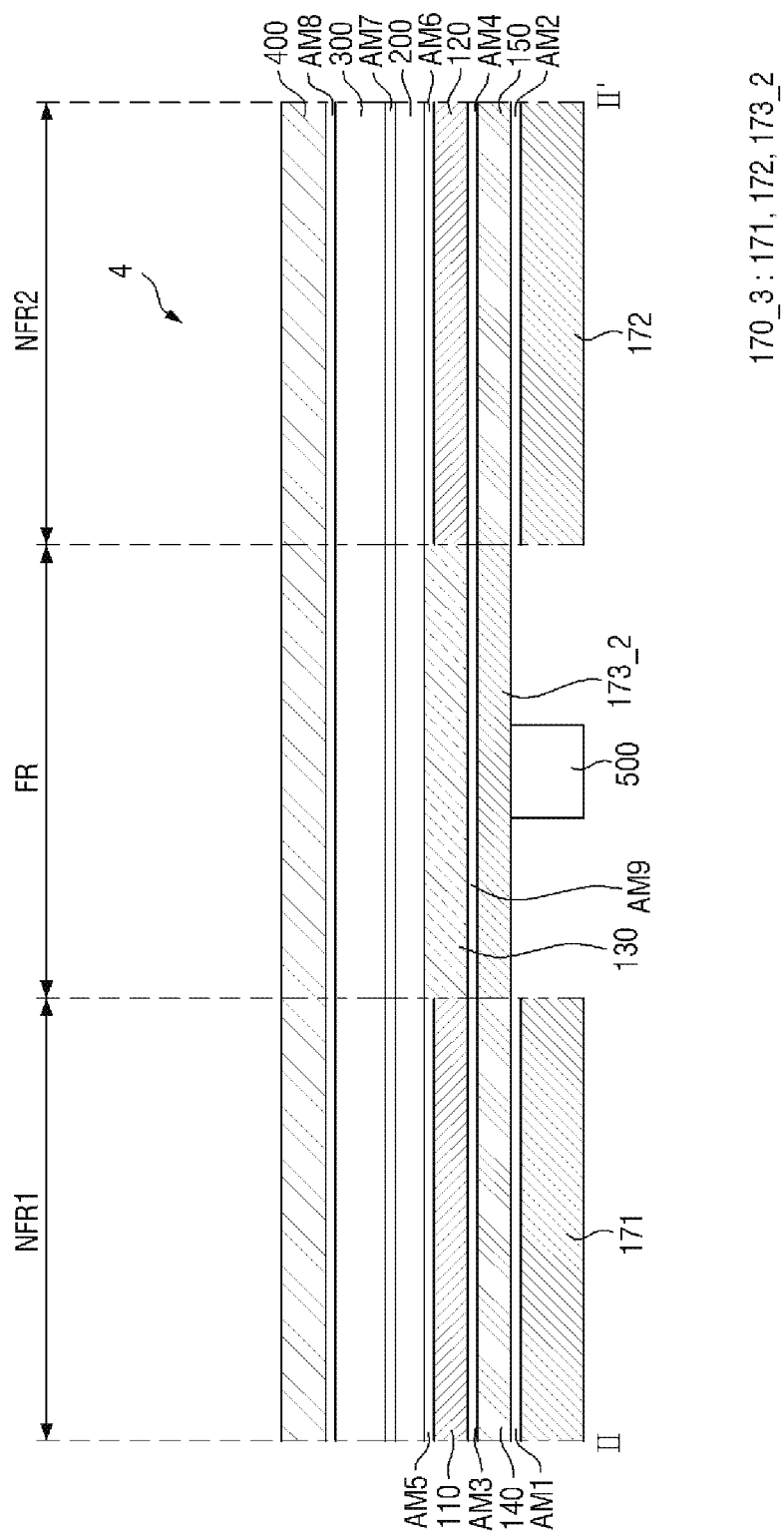
FIG. 9 is a cross-sectional view of a display device according to an exemplary embodiment.

FIG. 9 is a cross-sectional view of a display device according to an exemplary embodiment.

Referring to FIG. 9, a display device 4 according to an exemplary embodiment is different from the display device 1 according to an exemplary embodiment in that the first and second metal portions 171 and 172 adjacent to the third metal portion 173_2 are separated from each other as shown in FIG. 8 and in that the third metal portion 173_2 has a shape extending to the boundary between the folding region FR and the non-folding regions NFR1 and NFR2 in the first direction DR1.

For example, in the display device 4 according to an exemplary embodiment, the first and second metal portions 171 and 172 adjacent to the third metal portion 173_2 may be separated from each other, and the third metal portion 173_2 may have a shape extending to the boundary between the folding region FR and the non-folding regions NFR1 and NFR2 in the first direction DR1.

Since components and aspects have been described with reference to FIGS. 7 and 8, a redundant description will be omitted below.

Figure 10:
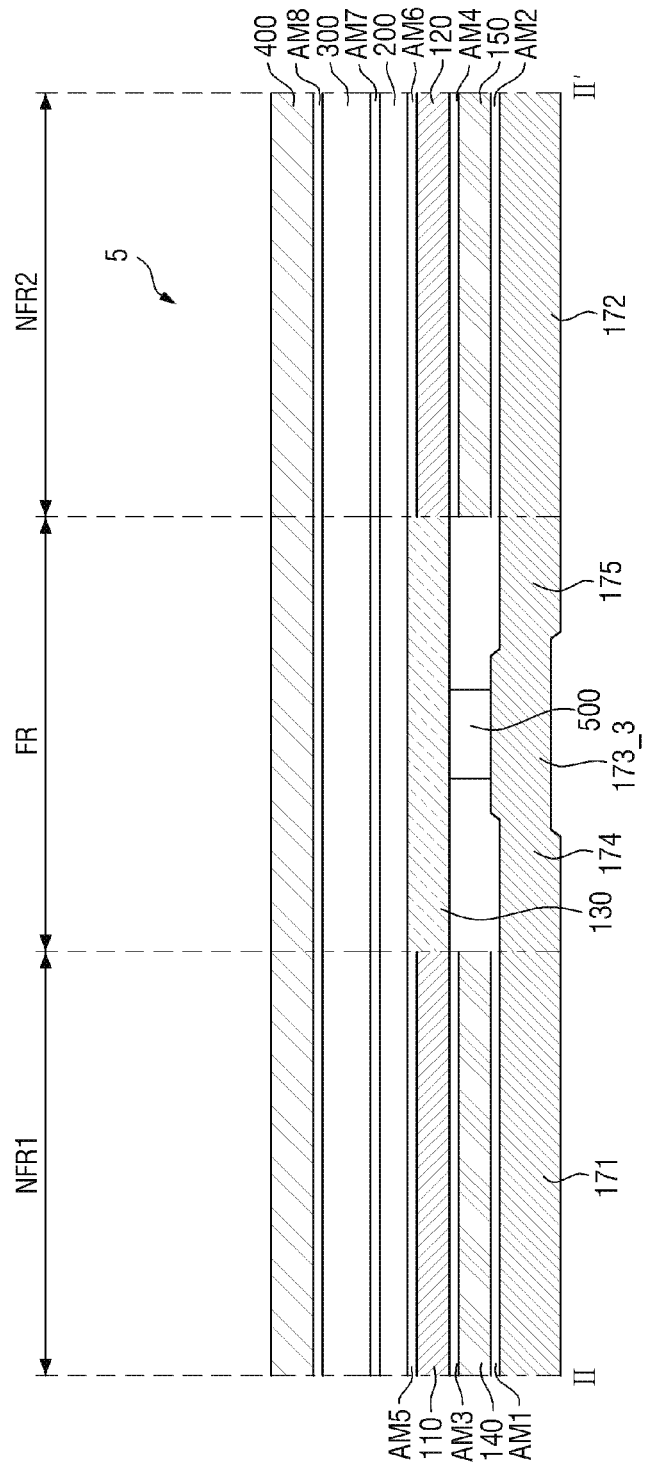
FIG. 10 is a cross-sectional view of a display device according to an exemplary embodiment.

FIG. 10 is a cross-sectional view of a display device according to an exemplary embodiment.

Referring to FIG. 10, a display device 5 according to an exemplary embodiment is different from the display device 1 according to an exemplary embodiment in that the fingerprint sensor 500 is disposed between the metal layer 170_4 and the light blocking pattern 130.

For example, in the display device 5 according to an exemplary embodiment, the fingerprint sensor 500 may be disposed between the metal layer 170_4 and the light blocking pattern 130.

As described above with reference to FIG. 2, the fingerprint sensor 500 may be attached onto the third metal portion 173_3 of the metal layer 170_4. The fingerprint sensor 500 may be attached to the lower surface of the light blocking pattern 130 through an adhesive film. The adhesive film may be substantially the same material as the aforementioned first adhesive film AM1.

Even in the display device 5 according to an exemplary embodiment, the support members 110 and 120 and the buffer members 140 and 150 are spaced apart from each other with the folding region FR interposed therebetween, and thus, the display device 5 may be more easily folded with respect to the folding region FR. For example, the display device 5 may have bending flexibility.

Further, in a comparative example, when a user's finger is in contact with the surface of the window 400 and the fingerprint sensor 500 is operated, the sensitivity of the fingerprint sensor 500 may be deteriorated due to the configuration between the fingerprint sensor 500 and the user's finger. In contrast, in an exemplary embodiment, the support members 110 and 120 and the buffer members 140 and 150 are spaced apart from each other with the folding region FR interposed therebetween, and thus, the sensitivity of the fingerprint sensor 500 may be prevented from being deteriorated by the configuration between the fingerprint sensor 500 and the user's finger.

As described above, when the support members 110 and 120 and the buffer members 140 and 150 are spaced apart from each other with the folding region FR interposed therebetween, the folding region FR of the display device 5 may be recessed in the thickness direction by applying pressure for fingerprint recognition because the support members 110 and 120 and the buffer members 140 and 150 are not disposed in the folding region FR as described above. Although the upper components disposed in the folding region FR of the display device 5 may be returned to their original position when the application of pressure by the user is completed, if this operation is repeated, the upper components disposed in the folding region FR of the display device 5 may have a shape indented in a downward direction even after the application of pressure by the user is completed. In this case, the appearance of the display device 5 may be poor, and/or the sensitivity of the fingerprint sensor 500 may be deteriorated.

However, in the display device 5 according to an exemplary embodiment, since the metal layer 170_4 is disposed even in the folding region FR to which pressure for the user's fingerprint recognition is applied, and for example, supports the fingerprint sensor 500 and the upper components, the depression of the folding region FR of the display device 5 in the thickness direction may be reduced when the user applies pressure for fingerprint recognition to the surface of the window 400 located in the folding region FR. Thus, deterioration of the appearance of the display device 5 and deterioration of the sensitivity of the fingerprint sensor 500 may be reduced.

Figure 11:
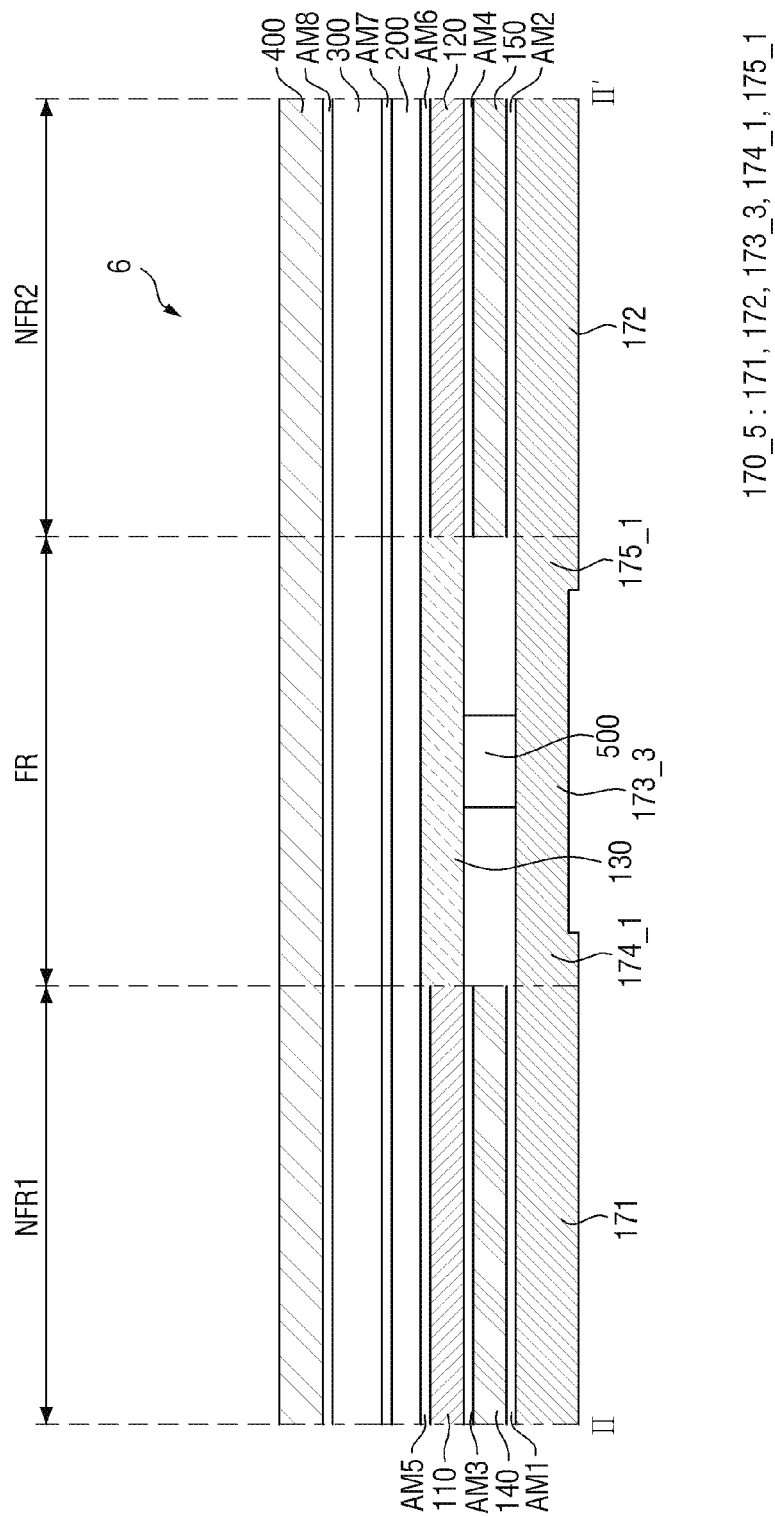
FIG. 11 is a cross-sectional view of a display device according to an exemplary embodiment.

FIG. 11 is a cross-sectional view of a display device according to an exemplary embodiment.

Referring to FIG. 11, a display device 6 according to an exemplary embodiment is different from the display device 5 according to an exemplary embodiment of FIG. 10 in that the fourth metal portion 174_1 and fifth metal portion 175_1 of the metal layer 170_5 are in contact with the inner side surfaces of the buffer members 140 and 150, respectively, as shown in FIG. 7.

For example, in the display device 6 according to an exemplary embodiment, the fingerprint sensor 500 may be disposed between the metal layer 170_5 and the light blocking pattern 130, and the fourth metal portion 174_1 and the fifth metal portion 175_1 may be in contact with the inner side surfaces of the buffer members 140 and 150, respectively.

The third metal portion 173_3 may be substantially the same as the width of the folding region FR in the first direction DR1. For example, the third metal portion 173_3 may have a shape extending to a boundary between the folding region FR and the non-folding regions NFR1 and NFR2 in the first direction DR1.

Unlike the fourth and fifth metal portions 174 and 175 of FIG. 2, the fourth and fifth metal portions 174_1 and 175_1 may have a shape extending vertically along the thickness direction (third direction DR3).

According to the display device 6 of an exemplary embodiment, since the third metal portion 173_3 has a shape extending to the boundary between the folding region FR and the non-folding regions NFR1 and NFR2 in the first direction DR1, the depression of the folding region FR of the display device 5 in the thickness direction may be reduced when the user applies pressure for fingerprint recognition to the surface of the window 400 located in the folding region FR. Thus, deterioration of the appearance of the display device 5 and deterioration of the sensitivity of the fingerprint sensor 500 may be reduced.

Figure 12:
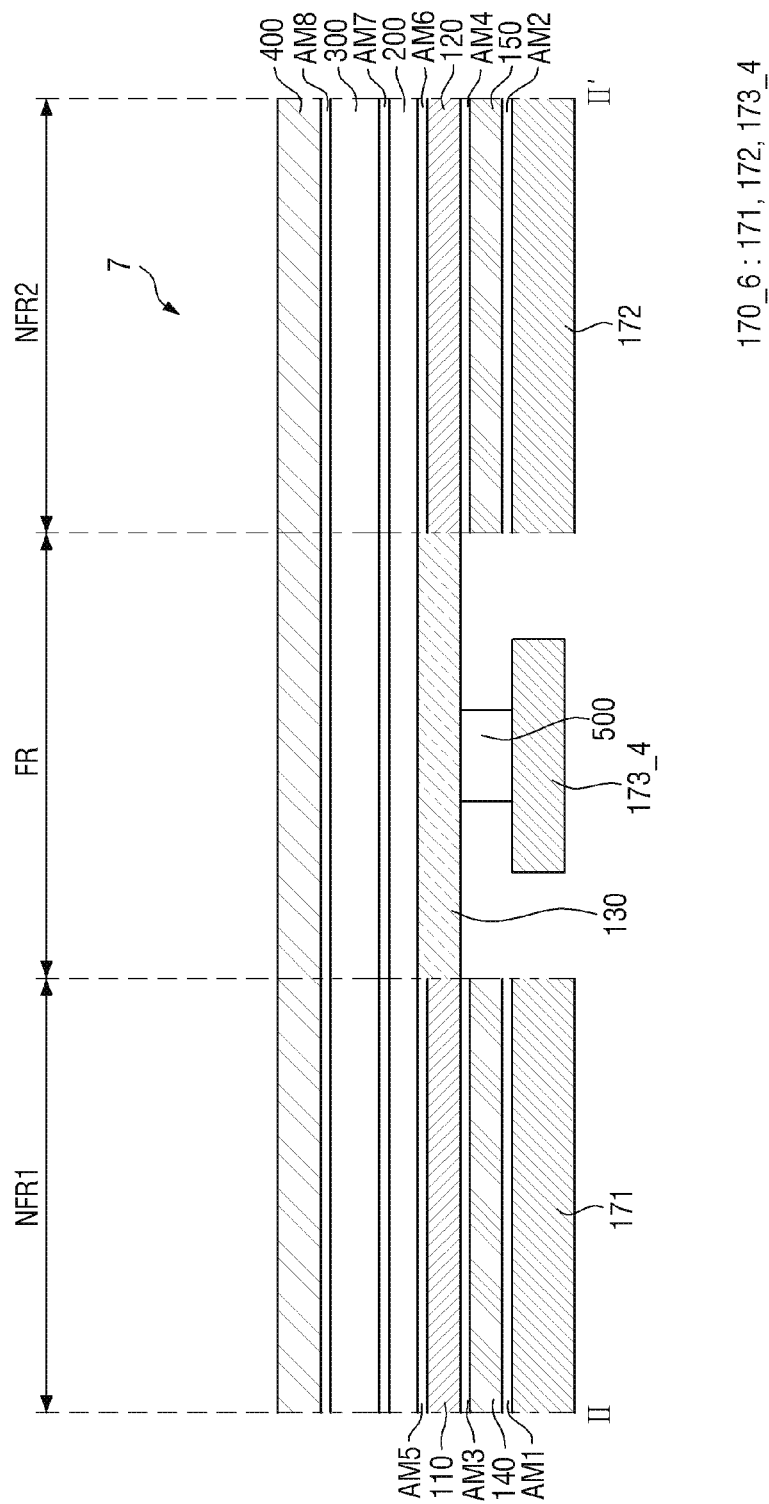
FIG. 12 is a cross-sectional view of a display device according to an exemplary embodiment.

FIG. 12 is a cross-sectional view of a display device according to an exemplary embodiment.

Referring to FIG. 12, a display device 7 according to an exemplary embodiment is different from the display device 5 according to an exemplary embodiment of FIG. 10 in that the first and second metal portions 171 and 172 adjacent to the third metal portion 173_4 are spaced apart from each other.

For example, in the display device 7 according to an exemplary embodiment, the first and second metal portions 171 and 172 adjacent to the third metal portion 173_4 may be spaced apart from each other. For example, the fourth and fifth metal portions 174 and 175 described above with reference to FIG. 10 are omitted, and thus, the metal layer 170-6 may have a plurality of portions spaced apart from each other.

Even in the display device 7 according to an exemplary embodiment, the support members 110 and 120 and the buffer members 140 and 150 are spaced apart from each other with the folding region FR interposed therebetween, and thus, the display device 7 may be more easily folded with respect to the folding region FR. For example, the display device 7 may have bending flexibility.

Further, when a user's finger is in contact with the surface of the window 400 and the fingerprint sensor 500 is operated, the sensitivity of the fingerprint sensor 500 may be deteriorated due to the configuration between the fingerprint sensor 500 and the user's finger. In contrast, in an exemplary embodiment, the support members 110 and 120 and the buffer members 140 and 150 are spaced apart from each other with the folding region FR interposed therebetween, and thus, the sensitivity of the fingerprint sensor 500 may be prevented from being deteriorated due to the configuration between the fingerprint sensor 500 and the user's finger.

As described above, when the support members 110 and 120 and the buffer members 140 and 150 are spaced apart from each other with the folding region FR interposed therebetween, the folding region FR of the display device 7 may be recessed in the thickness direction by applying pressure for fingerprint recognition because the support members 110 and 120 and the buffer members 140 and 150 are not disposed in the folding region FR as described above. Although the upper components disposed in the folding region FR of the display device 7 may be returned to their original position when the application of pressure by the user is completed, if this operation is repeated, the upper components disposed in the folding region FR of the display device 7 may have a shape indented in a downward direction even after the application of pressure by the user is completed. In this case, the appearance of the display device 7 may be poor, and/or the sensitivity of the fingerprint sensor 500 may be deteriorated.

However, in the display device 7 according to an exemplary embodiment, since the metal layer 170_6 is disposed even in the folding region FR to which pressure for the user's fingerprint recognition is applied, the depression of the folding region FR of the display device 7 in the thickness direction may be reduced when the user applies pressure for fingerprint recognition to the surface of the window 400 located in the folding region FR. Thus, deterioration of the appearance of the display device 7 and deterioration of the sensitivity of the fingerprint sensor 500 may be reduced.

Figure 13:
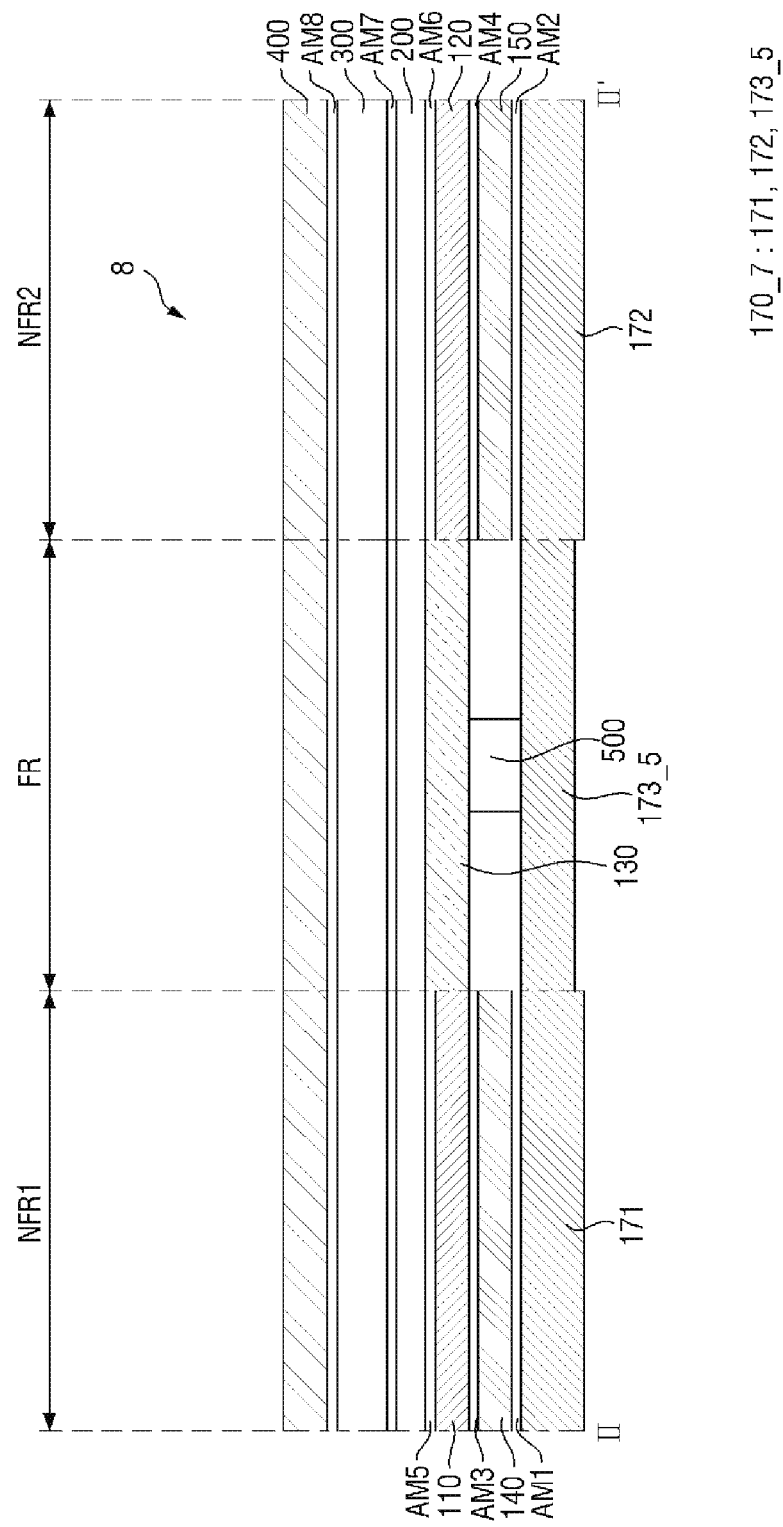
FIG. 13 is a cross-sectional view of a display device according to an exemplary embodiment.

FIG. 13 is a cross-sectional view of a display device according to an exemplary embodiment.

Referring to FIG. 13, a display device 8 according to an exemplary embodiment is different from the display device 5 according to an exemplary embodiment of FIG. 10 in that the fourth and fifth metal portions are omitted as shown in FIG. 12, and in that the third metal portion 173_5 of the metal layer 170_7 has a shape extending to the boundary between the folding region FR and the non-folding regions NFR1 and NFR2 in the first direction DR1 as shown in FIG. 11.

For example, in the display device 8 according to an exemplary embodiment, the first and second metal portions 171 and 172 adjacent to the third metal portion 173_5 may be separated from each other, and the third metal portion 173_5 may have a shape extending to the boundary between the folding region FR and the non-folding regions NFR1 and NFR2 in the first direction DR1. The first and second metal portions 171 and 172 adjacent to the third metal portion 173_5 may be connected to each other.

Since details thereof have been described with reference to FIGS. 10, 11, and 12, a redundant description will be omitted below.

Figure 14:
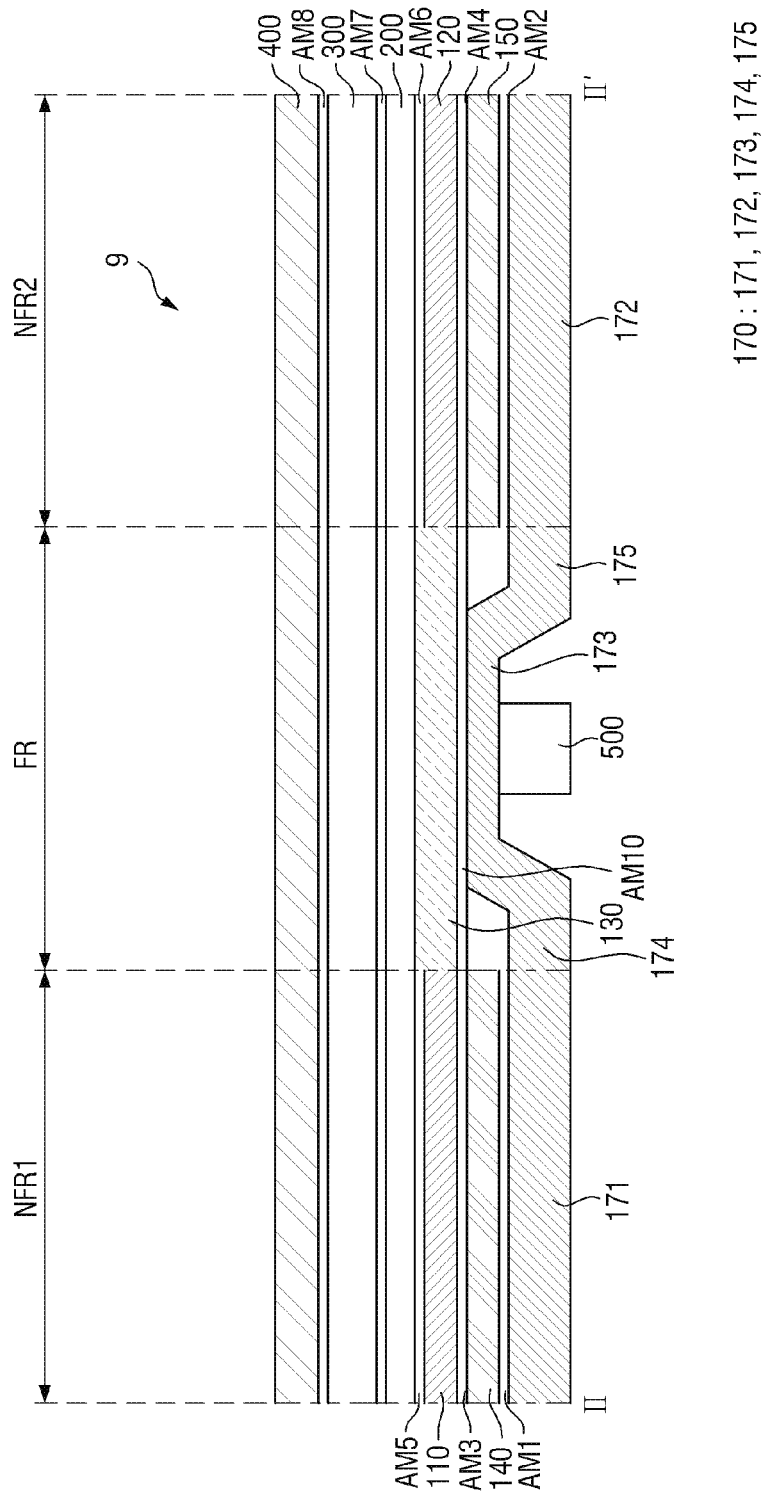
FIG. 14 is a cross-sectional view of a display device according to an exemplary embodiment.

FIG. 14 is a cross-sectional view of a display device according to an exemplary embodiment.

Referring to FIG. 14, a display device 9 according to an exemplary embodiment is different from the display device 1 according to an exemplary embodiment in that the ninth adhesive film AM9 is omitted and a tenth adhesive film AM10 is disposed in a region in which the ninth adhesive film AM9 is disposed.

For example, the tenth adhesive film AM10 may be disposed in the folding region FR, and may be disposed between the metal layer 170 and the light blocking pattern 130. The tenth adhesive film AM10 may be in contact with the adjacent third and fourth adhesive films AM3 and AM4. However, the present invention is not limited thereto.

The tenth adhesive film AM10 may have higher strength than each of the adjacent third and fourth adhesive films AM3 and AM4. The tenth adhesive film AM10 may include the same material as the aforementioned first to eighth adhesive films AM1 to AM8, but may have higher strength through, for example, an ultraviolet curing process. Thus, the depression of the folding region FR of the display device 9 in the thickness direction may be reduced when the user applies pressure for fingerprint recognition to the surface of the window 400 located in the folding region FR. Thus, deterioration of the appearance of the display device 9 and deterioration of the sensitivity of the fingerprint sensor 500 may be reduced.

Figure 15:
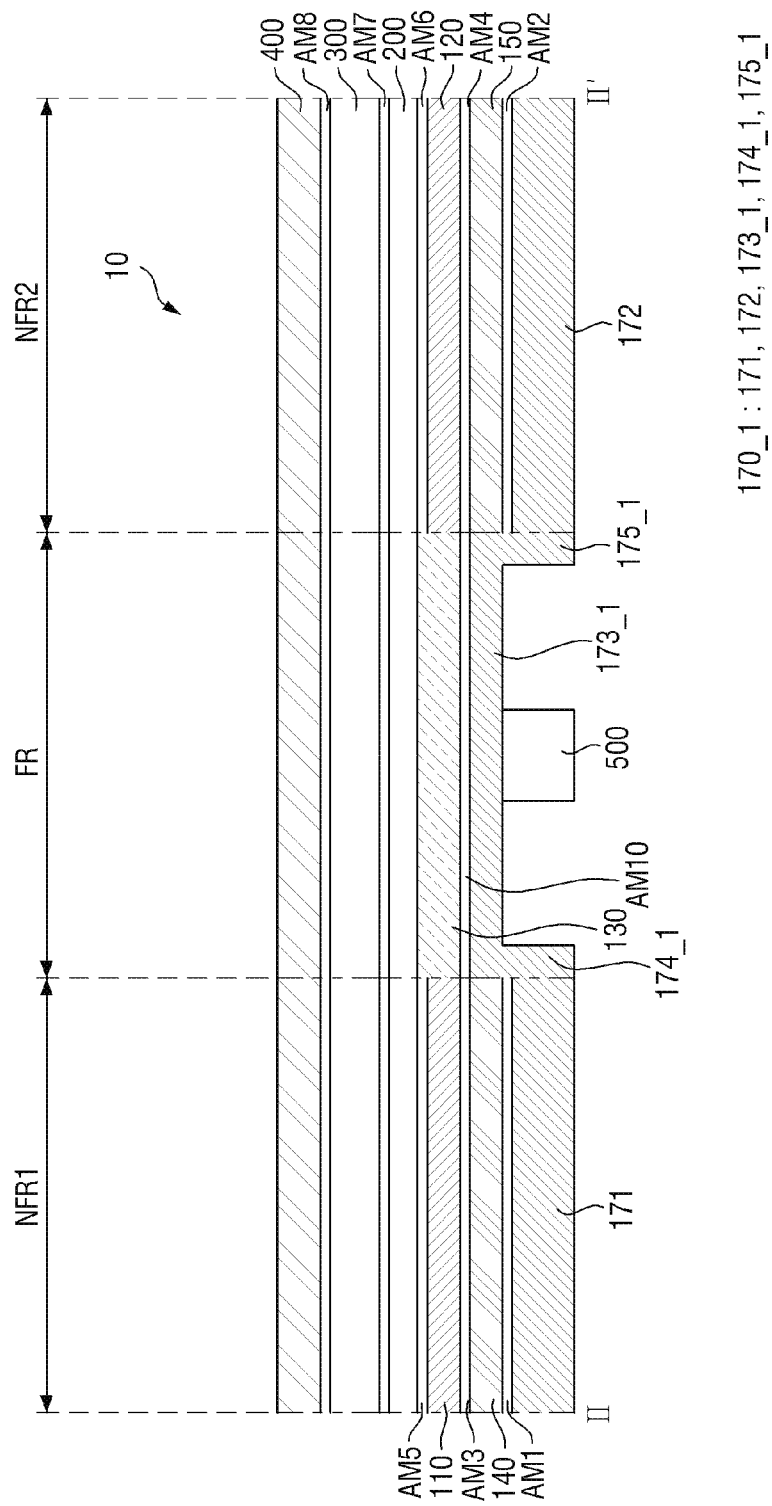
FIG. 15 is a cross-sectional view of a display device according to an exemplary embodiment.

FIG. 15 is a cross-sectional view of a display device according to an exemplary embodiment.

Referring to FIG. 15, a display device 10 according to an exemplary embodiment is different from the display device 9 according to an exemplary embodiment of FIG. 14 in that the metal layer 170_1 according to FIG. 7 is applied.

Since other components and aspects relating to FIG. 15 have been described above with reference to FIGS. 7 and 14, a redundant description will be omitted.

Figure 16:
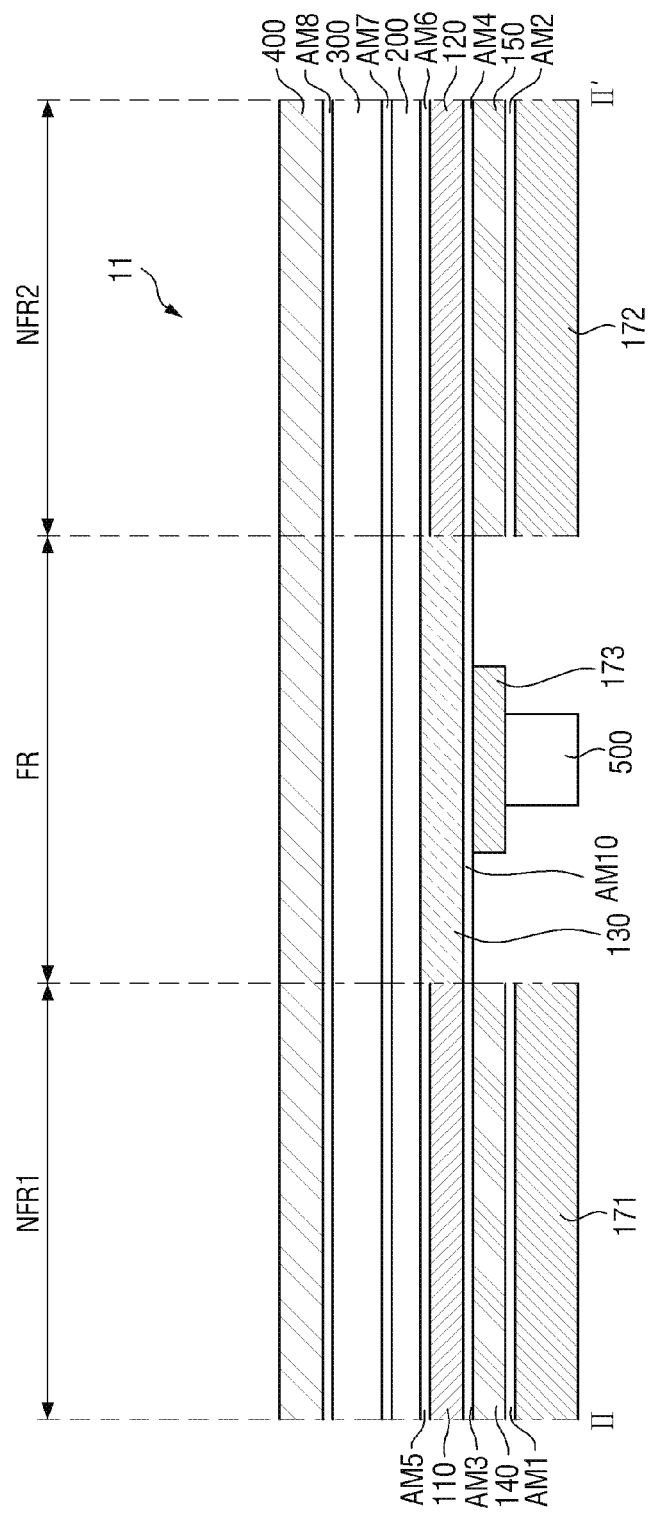
FIG. 16 is a cross-sectional view of a display device according to an exemplary embodiment.

FIG. 16 is a cross-sectional view of a display device according to an exemplary embodiment.

Referring to FIG. 16, a display device 11 according to an exemplary embodiment is different from the display device 9 according to an exemplary embodiment of FIG. 14 in that the metal layer 170_2 according to FIG. 8 is applied.

Since other components and aspects relating to FIG. 16 have been described above with reference to FIGS. 8 and 14, a redundant description will be omitted.

Figure 17:
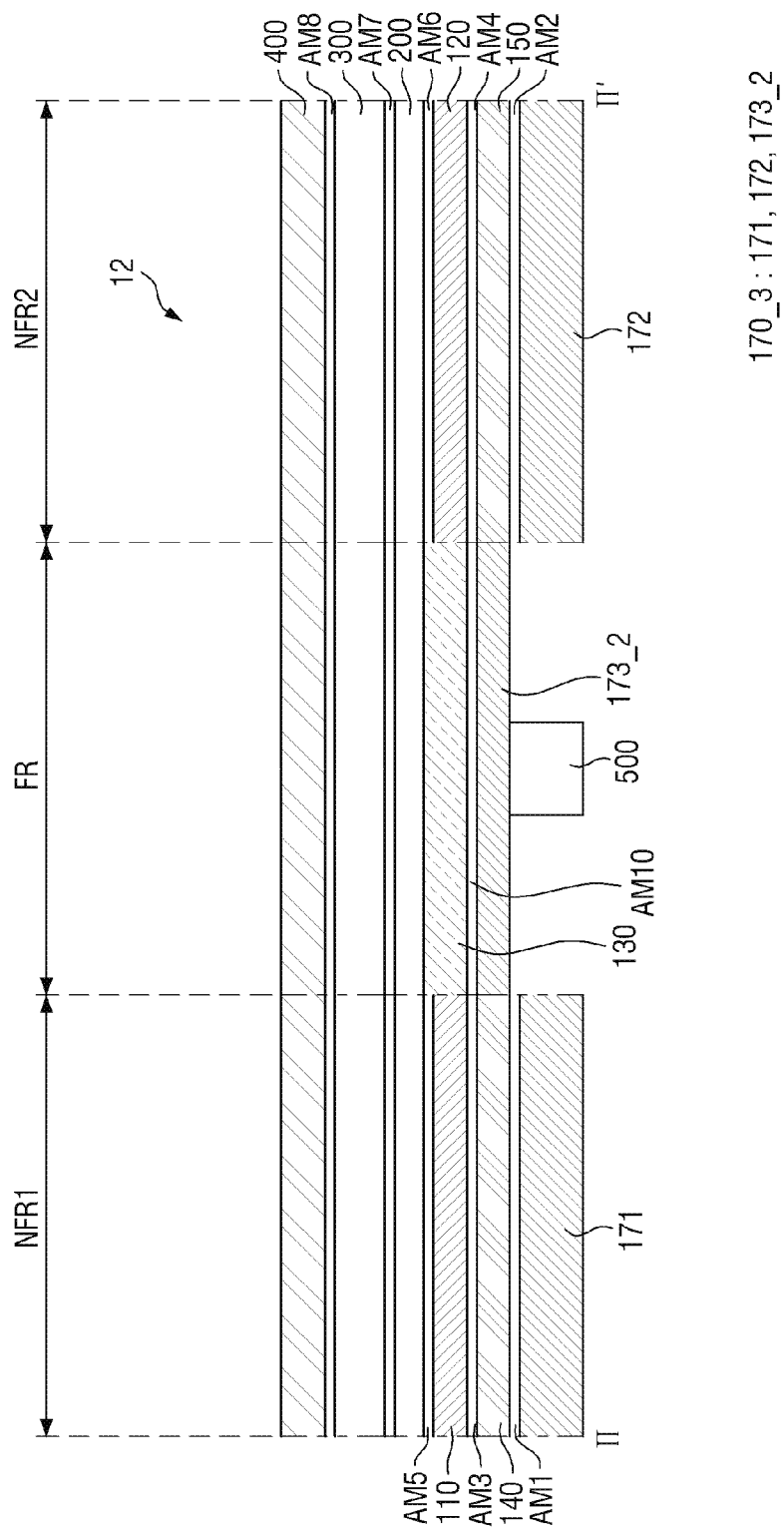
FIG. 17 is a cross-sectional view of a display device according to an exemplary embodiment.

FIG. 17 is a cross-sectional view of a display device according to an exemplary embodiment.

Referring to FIG. 17, a display device 12 according to an exemplary embodiment is different from the display device 9 according to an exemplary embodiment of FIG. 14 in that the metal layer 170_3 according to FIG. 9 is applied.

Since other components and aspects relating to FIG. 17 have been described above with reference to FIGS. 9 and 14, a redundant description will be omitted.

Figure 18:
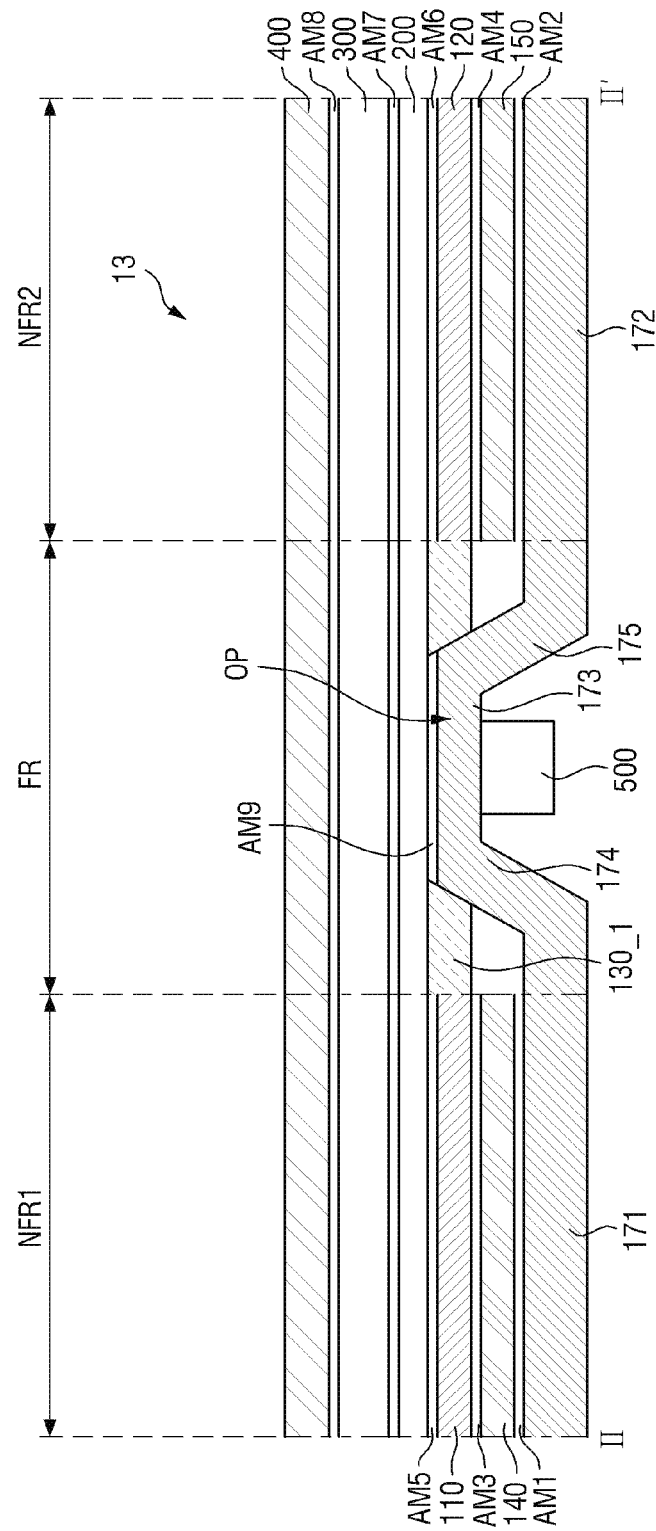
FIG. 18 is a cross-sectional view of a display device according to an exemplary embodiment.

FIG. 18 is a cross-sectional view of a display device according to an exemplary embodiment.

Referring to FIG. 18, a display device 13 according to an exemplary embodiment is different from the display device 1 according to an exemplary embodiment in that the display device 13 includes an opening OP in the center of the light blocking pattern 130_1 of the folding region FR. The opening OP of the light blocking pattern 130_1 may overlap the third metal portion 173 and the fingerprint sensor 500 in the thickness direction.

For example, in the display device 13 according to an exemplary embodiment, the metal layer 170 may be further provided in the opening OP of the light blocking pattern 130_1. For example, the third metal portion 173 of the metal layer 170 may be disposed in the opening OP of the light blocking pattern 130_1. The third metal portion 173 may be attached to the bottom surface (or one surface) of the display panel 200 through the ninth adhesive layer AM9. The outer side surfaces of the fourth and fifth metal parts 174 and 175 may be in contact with the adjacent light blocking pattern 130_1. However, the present invention is not limited thereto.

According to the display device 13 of an exemplary embodiment, the sensitivity of the fingerprint sensor 500 may be further increased by removing the light blocking pattern 130_1 from the region overlapping the fingerprint sensor 500.

FIG. 19 is a cross-sectional view of a display device according to an exemplary embodiment.

Referring to FIG. 19, a display device 14 according to an exemplary embodiment is different from the display device 1 according to an exemplary embodiment in that the third to fifth metal portions 173 to 175 of the metal layer 170_8 are omitted, the lower surface of the light blocking pattern 130 of the folding region FR is exposed, and the metal sheet 180 is disposed in a space between the support members 110 and 120 and the buffer members 140 and 150.

For example, in the display device 14 according to an exemplary embodiment, the third to fifth metal portions 173 to 175 of the metal layer 170_8 are omitted, the lower surface of the light blocking pattern 130 of the folding region FR may be exposed, and the metal sheet 180 may be disposed in a space between the support members 110 and 120 and the buffer members 140 and 150.

The metal sheet 180 may include a first metal sheet portion 181 disposed in the first non-folding region NFR1, a second metal sheet portion 182 disposed in the second non-folding region NFR2, a third metal sheet portion 183 disposed in the folding region FR, a fourth metal sheet portion 184 connecting the first metal sheet portion 181 and the third metal sheet portion 183, and a fifth metal sheet portion 185 connecting the second metal sheet portion 182 and the third metal sheet portion 183.

The first metal sheet portion 181, the second metal sheet portion 182, and the third metal sheet portion 183 may have a linear shape along the first direction DR1. The fourth and fifth metal sheet portions 184 and 185 may extend vertically along the thickness direction (third direction DR3) as shown in FIG. 19. However, the present invention is not limited thereto. For example, in an exemplary embodiment, the fourth and fifth metal sheet portions 184 and 185 may have the same shape as the aforementioned fourth and fifth metal portions 174 and 175, respectively.

The third metal sheet portion 183 may be attached to the light blocking pattern 130 through an eleventh adhesive film AM11, the first metal sheet portion 181 may be attached to the first metal portion 171 through a twelfth adhesive film AM12, and the second metal sheet portion 182 may be attached to the second metal portion 172 through a thirteenth adhesive film AM13.

The eleventh to thirteenth adhesive films AM11 to AM13 may include substantially the same material as the aforementioned first adhesive film AM1.

The metal sheet 180 may include a metal material.

According to exemplary embodiments of the present invention, a display device is provided in which deformation due to the pressure for pressing a fingerprint sensor in the folding region of the display device is improved.

The effects of the exemplary embodiments are not limited by the above disclosure, and other various effects may be provided.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
    a display panel disposed in a first non-folding region, a second non-folding region, and a folding region,
      wherein the folding region is between the first non-folding region and the second non-folding region;
    a first buffer member disposed on one surface of the display panel in the first non-folding region;
    a second buffer member disposed on the one surface of the display panel in the second non-folding region;
    a metal layer disposed in the first non-folding region, the second non-folding region, and the folding region on one surface of the first buffer member and one surface of the second buffer member; and a fingerprint sensor disposed on the metal layer, wherein the first buffer member and the second buffer member are separated from each other with the folding region therebetween, the metal layer comprises a first metal portion located in the first non-folding region, a second metal portion located in the second non-folding region, and a third metal portion located in the folding region, and the fingerprint sensor is attached to the third metal portion.

2. The display device of claim 1, further comprising:

a first support member disposed on the one surface of the display panel in the first non-folding region; and a second support member disposed on the one surface of the display panel in the second non-folding region, wherein the first support member is disposed between the display panel and the first buffer member, and the second support member is disposed between the display panel and the second buffer member.

3. The display device of claim 2, wherein the first support member and the second support member are separated from each other with the folding region therebetween.

4. The display device of claim 3, wherein the third metal portion is located closer to the display panel as compared with the first metal portion and the second metal portion.

5. The display device of claim 4, further comprising:

a light blocking pattern disposed between the third metal portion and the display panel in the folding region, wherein the light blocking pattern comprises an opaque material.

6. The display device of claim 5, wherein the metal layer further comprises a fourth metal portion connecting the third metal portion and the first metal portion, and a fifth metal portion connecting the third metal portion and the second metal portion.

7. The display device of claim 6, wherein the fourth metal portion is in contact with the first buffer member, and the fifth metal portion is in contact with the second buffer member.

8. The display device of claim 5, wherein the third metal portion extends to a boundary between the folding region and the first non-folding region and a boundary between the folding region and the second non-folding region.

9. The display device of claim 5, wherein the fingerprint sensor is spaced apart from the light blocking pattern with the third metal portion therebetween.

10. The display device of claim 9, further comprising:

a first adhesive member disposed between the light blocking pattern and the third metal portion;

a second adhesive member disposed between the first support member and the first buffer member; and a third adhesive member disposed between the second support member and the second buffer member, wherein the first adhesive member has a higher strength than each of the second adhesive member and the third adhesive member.

11. The display device of claim 5, wherein the fingerprint sensor is disposed between the third metal portion and the light blocking pattern.

12. The display device of claim 5, wherein the light blocking pattern comprises an opening in a region overlapping the third metal portion, and the third metal portion is disposed in the opening of the light blocking pattern.

13. The display device of claim 1, wherein the first non-folding region and the second non-folding region overlap each other in a thickness direction when the folding region is folded.

14. The display device of claim 1, further comprising:

a window disposed on another surface of the display panel which opposes the one surface of the display panel; and an upper functional member disposed between the display panel and the window, wherein the upper functional member comprises at least one of a polarization layer, a touch sensing layer, and an anti-reflective layer.

15. The display device of claim 1, wherein the fingerprint sensor is an ultrasonic fingerprint sensor or an optical fingerprint sensor.

16. A display device, comprising:

a display panel disposed in a first non-folding region, a second non-folding region, and a folding region, wherein the folding region is between the first non-folding region and the second non-folding region;

a first buffer member disposed on one surface of the display panel and in the first non-folding region;

a second buffer member disposed on the one surface of the display panel and in the second non-folding region;

a first metal layer overlapping the first buffer member and spaced apart from the display panel with the first buffer member therebetween;

a second metal layer overlapping the second buffer member and spaced apart from the display panel with the second buffer member therebetween;

a metal sheet comprising a first metal sheet portion located in the first non-folding region, a second metal sheet portion located in the second non-folding region, and a third metal sheet portion located in the folding region; and a fingerprint sensor attached to the third metal sheet portion of the metal sheet, wherein the first buffer member and the second buffer member are separated from each other with the folding region therebetween, and the first metal layer and the second metal layer are separated from each other with the folding region therebetween.

17. The display device of claim 16, wherein the third metal sheet portion is located closer to the display panel as compared with the first metal sheet portion and the second metal sheet portion.

18. The display device of claim 17, further comprising:

a light blocking pattern disposed between the third metal sheet portion and the display panel in the folding region, wherein the light blocking pattern comprises an opaque material.

19. The display device of claim 18, wherein the metal sheet further comprises a fourth metal sheet portion connecting the third metal sheet portion and the first metal sheet portion, and a fifth metal sheet portion connecting the third metal sheet portion and the second metal sheet portion.

20. The display device of claim 19, wherein the first metal sheet portion is attached to the first metal layer, the second metal sheet portion is attached to the second metal layer, and the third metal sheet portion is attached to the light blocking pattern.

\* \* \* \* \*